(12) United States Patent
Lung et al.

(10) Patent No.: US 8,089,137 B2
(45) Date of Patent: Jan. 3, 2012

(54) INTEGRATED CIRCUIT MEMORY WITH SINGLE CRYSTAL SILICON ON SILICIDE DRIVER AND MANUFACTURING METHOD

(75) Inventors: Hsiang-Lan Lung, Elmsford, NY (US); Erh-Kun Lai, Elmsford, NY (US)

(73) Assignee: Macronix International Co., Ltd., Hsinchu (TW)

( * ) Notice: Subject to any disclaimer, the term of this patent is extended or adjusted under 35 U.S.C. 154(b) by 396 days.

(21) Appl. No.: 12/349,874

(22) Filed: Jan. 7, 2009

(65) Prior Publication Data

US 2010/0171086 A1 Jul. 8, 2010

(51) Int. Cl.
*H01L 27/10* (2006.01)
*H01L 29/861* (2006.01)
*H01L 21/324* (2006.01)

(52) U.S. Cl. ............... 257/601; 257/754; 257/E27.073; 257/E29.327; 438/682

(58) Field of Classification Search .................. 257/601
See application file for complete search history.

(56) References Cited

U.S. PATENT DOCUMENTS

| | | | |
|---|---|---|---|
| 3,271,591 A | 9/1966 | Ovshinsky | |
| 3,530,441 A | 9/1970 | Ovshinsky | |
| 4,452,592 A | 6/1984 | Tsai | |
| 4,554,045 A * | 11/1985 | Bean et al. | 117/105 |
| 4,599,705 A | 7/1986 | Holmberg et al. | |
| 4,719,594 A | 1/1988 | Young et al. | |
| 4,769,339 A | 9/1988 | Ishii et al. | |
| 4,876,220 A | 10/1989 | Mohsen et al. | |
| 4,959,812 A | 9/1990 | Momodomi et al. | |
| 5,106,775 A | 4/1992 | Kaga et al. | |
| 5,166,096 A | 11/1992 | Cote et al. | |
| 5,166,758 A | 11/1992 | Ovshinsky et al. | |
| 5,177,567 A | 1/1993 | Klersy et al. | |
| 5,236,872 A | 8/1993 | van Ommen et al. | |
| 5,332,923 A | 7/1994 | Takeuchi et al. | |
| 5,391,901 A | 2/1995 | Tanabe et al. | |

(Continued)

FOREIGN PATENT DOCUMENTS

EP 0494598 7/1992

(Continued)

OTHER PUBLICATIONS

Yonehara, T. et al., "Control of Grain Boundary Location by Selective Nucleation Over Amorphous Substrates," Mat. Res. Soc. Symp. Proc., vol. 106, 1998, pp. 21-26.

(Continued)

*Primary Examiner* — Stephen W Smoot
(74) *Attorney, Agent, or Firm* — Haynes Beffel & Wolfeld LLP

(57) ABSTRACT

A memory device includes a diode driver and a data storage element, such as an element comprising phase change memory material, and in which the diode driver comprises a silicide element on a silicon substrate with a single crystal silicon node on the silicide element. The silicide element separates the single crystal silicon node from the underlying silicon substrate, preventing the flow of carriers from the single crystal silicon node into the substrate, and is capable of acting as a conductive element for interconnecting devices on the device. The single crystal silicon node acts as one terminal of a diode, and a second semiconductor node is formed on top of it, acting as the other terminal of the diode.

19 Claims, 13 Drawing Sheets

U.S. PATENT DOCUMENTS

| | | |
|---|---|---|
| 5,515,488 A | 5/1996 | Hoppe et al. |
| 5,534,712 A | 7/1996 | Ovshinsky et al. |
| 5,550,396 A | 8/1996 | Tsutsumi et al. |
| 5,687,112 A | 11/1997 | Ovshinsky |
| 5,688,713 A | 11/1997 | Linliu et al. |
| 5,716,883 A | 2/1998 | Tseng et al. |
| 5,754,472 A | 5/1998 | Sim et al. |
| 5,789,277 A | 8/1998 | Zahorik et al. |
| 5,789,758 A | 8/1998 | Reinberg |
| 5,814,527 A | 9/1998 | Wolstenholme et al. |
| 5,831,276 A | 11/1998 | Gonzalez et al. |
| 5,837,564 A | 11/1998 | Sandhu et al. |
| 5,869,843 A | 2/1999 | Harshfield |
| 5,879,955 A | 3/1999 | Gonzalez et al. |
| 5,902,704 A | 5/1999 | Schoenborn et al. |
| 5,920,788 A | 7/1999 | Reinberg |
| 5,933,365 A | 8/1999 | Klersy et al. |
| 5,952,671 A | 9/1999 | Reinberg et al. |
| 5,958,358 A | 9/1999 | Tenne et al. |
| 5,970,336 A | 10/1999 | Wolstenholme et al. |
| 5,985,698 A | 11/1999 | Gonzalez et al. |
| 5,998,244 A | 12/1999 | Wolstenholme et al. |
| 6,011,272 A | 1/2000 | Omid-Zohoor et al. |
| 6,011,725 A | 1/2000 | Eitan |
| 6,025,220 A | 2/2000 | Sandhu |
| 6,031,287 A | 2/2000 | Harshfield |
| 6,034,882 A | 3/2000 | Johnson et al. |
| 6,046,951 A | 4/2000 | El Hajji |
| 6,066,870 A | 5/2000 | Siek |
| 6,077,674 A | 6/2000 | Schleifer et al. |
| 6,077,729 A | 6/2000 | Harshfield |
| 6,087,269 A | 7/2000 | Williams |
| 6,087,674 A | 7/2000 | Ovshinsky et al. |
| 6,104,038 A | 8/2000 | Gonzalez et al. |
| 6,111,264 A | 8/2000 | Wolstenholme et al. |
| 6,114,713 A | 9/2000 | Zahorik |
| 6,117,720 A | 9/2000 | Harshfield |
| 6,147,395 A | 11/2000 | Gilgen |
| 6,150,253 A | 11/2000 | Doan et al. |
| 6,153,890 A | 11/2000 | Wolstenholme et al. |
| 6,177,317 B1 | 1/2001 | Huang et al. |
| 6,185,122 B1 | 2/2001 | Johnson et al. |
| 6,189,582 B1 | 2/2001 | Reinberg et al. |
| 6,236,059 B1 | 5/2001 | Wolstenholme et al. |
| RE37,259 E | 7/2001 | Ovshinsky |
| 6,271,090 B1 | 8/2001 | Huang et al. |
| 6,280,684 B1 | 8/2001 | Yamada et al. |
| 6,287,887 B1 | 9/2001 | Gilgen |
| 6,291,137 B1 | 9/2001 | Lyons et al. |
| 6,314,014 B1 | 11/2001 | Lowrey et al. |
| 6,316,348 B1 | 11/2001 | Fu et al. |
| 6,320,786 B1 | 11/2001 | Chang et al. |
| 6,326,307 B1 | 12/2001 | Lindley et al. |
| 6,337,266 B1 | 1/2002 | Zahorik |
| 6,339,544 B1 | 1/2002 | Chiang et al. |
| 6,351,406 B1 | 2/2002 | Johnson et al. |
| 6,372,651 B1 | 4/2002 | Yang et al. |
| 6,380,068 B2 | 4/2002 | Jeng et al. |
| 6,420,215 B1 | 7/2002 | Knall et al. |
| 6,420,216 B1 | 7/2002 | Clevenger et al. |
| 6,420,725 B1 | 7/2002 | Harshfield |
| 6,423,621 B2 | 7/2002 | Doan et al. |
| 6,429,064 B1 | 8/2002 | Wicker |
| 6,440,837 B1 | 8/2002 | Harshfield |
| 6,462,353 B1 | 10/2002 | Gilgen |
| 6,483,736 B2 | 11/2002 | Johnson et al. |
| 6,487,106 B1 | 11/2002 | Kozicki |
| 6,487,114 B2 | 11/2002 | Jong et al. |
| 6,501,111 B1 | 12/2002 | Lowrey |
| 6,511,867 B2 | 1/2003 | Lowrey et al. |
| 6,512,241 B1 | 1/2003 | Lai |
| 6,514,788 B2 | 2/2003 | Quinn |
| 6,514,820 B2 | 2/2003 | Ahn et al. |
| 6,534,781 B2 | 3/2003 | Dennison |
| 6,545,903 B1 | 4/2003 | Wu |
| 6,551,866 B1 | 4/2003 | Maeda et al. |
| 6,555,860 B2 | 4/2003 | Lowrey et al. |
| 6,563,156 B2 | 5/2003 | Harshfield |
| 6,566,700 B2 | 5/2003 | Xu |
| 6,567,293 B1 | 5/2003 | Lowrey et al. |
| 6,576,546 B2 | 6/2003 | Gilbert et al. |
| 6,579,760 B1 | 6/2003 | Lung et al. |
| 6,586,761 B2 | 7/2003 | Lowrey |
| 6,589,714 B2 | 7/2003 | Maimon et al. |
| 6,593,176 B2 | 7/2003 | Dennison |
| 6,596,589 B2 | 7/2003 | Tseng et al. |
| 6,597,009 B2 | 7/2003 | Wicker |
| 6,605,527 B2 | 8/2003 | Dennison et al. |
| 6,605,821 B1 | 8/2003 | Lee et al. |
| 6,607,974 B2 | 8/2003 | Harshfield |
| 6,613,604 B2 | 9/2003 | Maimon et al. |
| 6,617,192 B1 | 9/2003 | Lowrey et al. |
| 6,621,095 B2 | 9/2003 | Chiang et al. |
| 6,627,530 B2 | 9/2003 | Li et al. |
| 6,639,849 B2 | 10/2003 | Takahashi et al. |
| 6,649,976 B2 | 11/2003 | Iwamatsu et al. |
| 6,653,733 B1 | 11/2003 | Gonzalez et al. |
| 6,673,700 B2 | 1/2004 | Dennison et al. |
| 6,674,115 B2 | 1/2004 | Hudgens et al. |
| 6,677,678 B2 | 1/2004 | Biolsi et al. |
| 6,737,675 B2 | 5/2004 | Patel et al. |
| 6,744,088 B1 | 6/2004 | Dennison |
| 6,750,079 B2 | 6/2004 | Lowrey et al. |
| 6,750,101 B2 | 6/2004 | Lung et al. |
| 6,791,102 B2 | 9/2004 | Johnson et al. |
| 6,797,979 B2 | 9/2004 | Chiang et al. |
| 6,800,504 B2 | 10/2004 | Li et al. |
| 6,800,563 B2 | 10/2004 | Xu |
| 6,815,298 B2 | 11/2004 | Tsuchiaki |
| 6,815,704 B1 | 11/2004 | Chen |
| 6,838,692 B1 | 1/2005 | Lung et al. |
| 6,850,432 B2 | 2/2005 | Lu et al. |
| 6,859,389 B2 | 2/2005 | Idehara et al. |
| 6,861,267 B2 | 3/2005 | Xu et al. |
| 6,864,500 B2 | 3/2005 | Gilton |
| 6,864,503 B2 | 3/2005 | Lung et al. |
| 6,867,638 B2 | 3/2005 | Saiki et al. |
| 6,881,603 B2 | 4/2005 | Lai |
| 6,888,750 B2 | 5/2005 | Walker et al. |
| 6,894,304 B2 | 5/2005 | Moore |
| 6,894,305 B2 | 5/2005 | Yi et al. |
| 6,900,517 B2 | 5/2005 | Tanaka et al. |
| 6,903,362 B2 | 6/2005 | Wyeth et al. |
| 6,909,107 B2 | 6/2005 | Rodgers et al. |
| 6,910,907 B2 | 6/2005 | Layadi et al. |
| 6,927,410 B2 | 8/2005 | Chen |
| 6,928,022 B2 | 8/2005 | Cho et al. |
| 6,933,516 B2 | 8/2005 | Xu |
| 6,936,544 B2 | 8/2005 | Huang et al. |
| 6,936,840 B2 | 8/2005 | Sun et al. |
| 6,937,507 B2 | 8/2005 | Chen |
| 6,943,365 B2 | 9/2005 | Lowrey et al. |
| 6,969,866 B1 | 11/2005 | Lowrey et al. |
| 6,972,428 B2 | 12/2005 | Maimon |
| 6,972,430 B2 | 12/2005 | Casagrande et al. |
| 6,977,181 B1 | 12/2005 | Raberg et al. |
| 6,992,932 B2 | 1/2006 | Cohen et al. |
| 7,023,009 B2 | 4/2006 | Kostylev et al. |
| 7,033,856 B2 | 4/2006 | Lung et al. |
| 7,038,230 B2 | 5/2006 | Chen et al. |
| 7,038,938 B2 | 5/2006 | Kang et al. |
| 7,042,001 B2 | 5/2006 | Kim et al. |
| 7,054,183 B2 | 5/2006 | Rinerson et al. |
| 7,067,837 B2 | 6/2006 | Hwang et al. |
| 7,067,864 B2 | 6/2006 | Nishida et al. |
| 7,067,865 B2 | 6/2006 | Lung et al. |
| 7,078,273 B2 | 7/2006 | Matsuoka et al. |
| 7,099,180 B1 | 8/2006 | Dodge et al. |
| 7,115,927 B2 | 10/2006 | Hideki et al. |
| 7,122,281 B2 | 10/2006 | Pierrat |
| 7,122,824 B2 | 10/2006 | Khouri et al. |
| 7,126,149 B2 | 10/2006 | Iwasaki et al. |
| 7,129,538 B2 | 10/2006 | Lee et al. |
| 7,132,675 B2 | 11/2006 | Gilton |
| 7,151,273 B2 | 12/2006 | Campbell et al. |
| 7,154,774 B2 | 12/2006 | Bedeschi et al. |
| 7,157,314 B2 | 1/2007 | Subramanian et al. |

| | | | | | | |
|---|---|---|---|---|---|---|
| 7,158,411 | B2 | 1/2007 | Yeh et al. | 2006/0113520 A1 | 6/2006 | Yamamoto et al. |
| 7,164,147 | B2 | 1/2007 | Lee et al. | 2006/0113521 A1 | 6/2006 | Lung |
| 7,166,533 | B2 | 1/2007 | Happ | 2006/0118913 A1 | 6/2006 | Yi et al. |
| 7,169,635 | B2 | 1/2007 | Kozicki | 2006/0124916 A1 | 6/2006 | Lung |
| 7,202,493 | B2 | 4/2007 | Lung et al. | 2006/0126395 A1 | 6/2006 | Chen et al. |
| 7,208,751 | B2 | 4/2007 | Ooishi et al. | 2006/0131555 A1 | 6/2006 | Liu et al. |
| 7,214,958 | B2 | 5/2007 | Happ | 2006/0138467 A1 | 6/2006 | Lung |
| 7,220,983 | B2 | 5/2007 | Lung | 2006/0154185 A1 | 7/2006 | Ho et al. |
| 7,229,883 | B2 | 6/2007 | Wang et al. | 2006/0157681 A1 | 7/2006 | Chen et al. |
| 7,230,286 | B2 | 6/2007 | Cohen et al. | 2006/0163554 A1 | 7/2006 | Lankhorst et al. |
| 7,238,959 | B2 | 7/2007 | Chen | 2006/0172067 A1 | 8/2006 | Ovshinsky et al. |
| 7,238,994 | B2 | 7/2007 | Chen et al. | 2006/0175599 A1 | 8/2006 | Happ |
| 7,248,494 | B2 | 7/2007 | Oh et al. | 2006/0198183 A1 | 9/2006 | Kawahara et al. |
| 7,251,157 | B2 | 7/2007 | Osada et al. | 2006/0205108 A1 | 9/2006 | Maimon et al. |
| 7,253,429 | B2 | 8/2007 | Klersy et al. | 2006/0211165 A1 | 9/2006 | Hwang et al. |
| 7,254,059 | B2 | 8/2007 | Li et al. | 2006/0226409 A1 | 10/2006 | Burr et al. |
| 7,269,052 | B2 | 9/2007 | Segal et al. | 2006/0234138 A1 | 10/2006 | Fehlhaber et al. |
| 7,277,317 | B2 | 10/2007 | Le Phan et al. | 2006/0237756 A1 | 10/2006 | Park et al. |
| 7,291,556 | B2 | 11/2007 | Choi et al. | 2006/0245236 A1 | 11/2006 | Zaidi |
| 7,309,630 | B2 | 12/2007 | Fan et al. | 2006/0250885 A1 | 11/2006 | Cho et al. |
| 7,309,921 | B2 | 12/2007 | Fukuro | 2006/0261392 A1 | 11/2006 | Lee et al. |
| 7,321,130 | B2 | 1/2008 | Lung et al. | 2006/0266993 A1 | 11/2006 | Suh et al. |
| 7,323,708 | B2 | 1/2008 | Lee et al. | 2006/0284157 A1 | 12/2006 | Chen et al. |
| 7,332,370 | B2 | 2/2008 | Chang et al. | 2006/0284158 A1 | 12/2006 | Lung et al. |
| 7,336,526 | B2 | 2/2008 | Osada et al. | 2006/0284214 A1 | 12/2006 | Chen |
| 7,351,648 | B2 | 4/2008 | Furukawa et al. | 2006/0284279 A1 | 12/2006 | Lung et al. |
| 7,359,231 | B2 | 4/2008 | Venkataraman et al. | 2006/0286709 A1 | 12/2006 | Lung et al. |
| 7,364,935 | B2 | 4/2008 | Lung et al. | 2006/0286743 A1 | 12/2006 | Lung et al. |
| 7,365,385 | B2 | 4/2008 | Abbott | 2006/0289848 A1 | 12/2006 | Dennison |
| 7,379,328 | B2 | 5/2008 | Osada et al. | 2007/0008786 A1 | 1/2007 | Scheuerlein |
| 7,385,235 | B2 | 6/2008 | Lung et al. | 2007/0030721 A1 | 2/2007 | Segal et al. |
| 7,394,088 | B2 | 7/2008 | Lung | 2007/0037101 A1 | 2/2007 | Morioka |
| 7,397,060 | B2 | 7/2008 | Lung | 2007/0096162 A1 | 5/2007 | Happ et al. |
| 7,423,300 | B2 | 9/2008 | Lung et al. | 2007/0096248 A1 | 5/2007 | Philipp et al. |
| 7,426,134 | B2 | 9/2008 | Happ et al. | 2007/0108077 A1 | 5/2007 | Lung et al. |
| 7,440,308 | B2 | 10/2008 | Jeong et al. | 2007/0108429 A1 | 5/2007 | Lung |
| 7,449,710 | B2 | 11/2008 | Lung | 2007/0108430 A1 | 5/2007 | Lung |
| 7,473,576 | B2 | 1/2009 | Lung | 2007/0108431 A1 | 5/2007 | Chen et al. |
| 7,479,649 | B2 | 1/2009 | Lung | 2007/0109836 A1 | 5/2007 | Lung |
| 7,507,986 | B2 | 3/2009 | Lung | 2007/0109843 A1 | 5/2007 | Lung et al. |
| 7,514,334 | B2 | 4/2009 | Chen et al. | 2007/0111429 A1 | 5/2007 | Lung |
| 7,515,461 | B2 | 4/2009 | Happ et al. | 2007/0115794 A1 | 5/2007 | Lung |
| 2002/0070457 | A1 | 6/2002 | Sun et al. | 2007/0117315 A1 | 5/2007 | Lai et al. |
| 2002/0113273 | A1 | 8/2002 | Hwang et al. | 2007/0120104 A1 | 5/2007 | Ahn et al. |
| 2003/0072195 | A1 | 4/2003 | Mikolajick | 2007/0121363 A1 | 5/2007 | Lung |
| 2003/0095426 | A1 | 5/2003 | Hush et al. | 2007/0121374 A1 | 5/2007 | Lung et al. |
| 2003/0186481 | A1 | 10/2003 | Lung | 2007/0126040 A1 | 6/2007 | Lung |
| 2004/0026686 | A1 | 2/2004 | Lung | 2007/0131922 A1 | 6/2007 | Lung |
| 2004/0051094 | A1 | 3/2004 | Ooishi | 2007/0138458 A1 | 6/2007 | Lung |
| 2004/0113137 | A1 | 6/2004 | Lowrey | 2007/0147105 A1 | 6/2007 | Lung et al. |
| 2004/0165422 | A1 | 8/2004 | Hideki et al. | 2007/0153563 A1 | 7/2007 | Nirschl |
| 2004/0248339 | A1 | 12/2004 | Lung | 2007/0154847 A1 | 7/2007 | Chen et al. |
| 2004/0256610 | A1 | 12/2004 | Lung | 2007/0155172 A1 | 7/2007 | Lai et al. |
| 2005/0018526 | A1 | 1/2005 | Lee | 2007/0156949 A1 | 7/2007 | Rudelic et al. |
| 2005/0029502 | A1 | 2/2005 | Hudgens | 2007/0158632 A1 | 7/2007 | Ho |
| 2005/0029587 | A1 | 2/2005 | Harshfield | 2007/0158633 A1 | 7/2007 | Lai et al. |
| 2005/0052904 | A1 | 3/2005 | Cho et al. | 2007/0158645 A1 | 7/2007 | Lung |
| 2005/0062087 | A1 | 3/2005 | Chen et al. | 2007/0158690 A1 | 7/2007 | Ho et al. |
| 2005/0093022 | A1 | 5/2005 | Lung | 2007/0158862 A1 | 7/2007 | Lung |
| 2005/0127349 | A1 | 6/2005 | Horak et al. | 2007/0161186 A1 | 7/2007 | Ho |
| 2005/0145984 | A1 | 7/2005 | Chen et al. | 2007/0170881 A1 | 7/2007 | Noh et al. |
| 2005/0167656 | A1 | 8/2005 | Sun et al. | 2007/0173019 A1 | 7/2007 | Ho et al. |
| 2005/0191804 | A1 | 9/2005 | Lai et al. | 2007/0173063 A1 | 7/2007 | Lung |
| 2005/0201182 | A1 | 9/2005 | Osada et al. | 2007/0176261 A1 | 8/2007 | Lung |
| 2005/0212024 | A1 | 9/2005 | Happ | 2007/0187664 A1 | 8/2007 | Happ |
| 2005/0212026 | A1 | 9/2005 | Chung et al. | 2007/0201267 A1 | 8/2007 | Happ et al. |
| 2005/0215009 | A1 | 9/2005 | Cho | 2007/0215852 A1 | 9/2007 | Lung |
| 2005/0263829 | A1 | 12/2005 | Song et al. | 2007/0224726 A1 | 9/2007 | Chen et al. |
| 2005/0270832 | A1 | 12/2005 | Chu et al. | 2007/0235811 A1 | 10/2007 | Furukawa et al. |
| 2006/0006472 | A1 | 1/2006 | Jiang | 2007/0236989 A1 | 10/2007 | Lung |
| 2006/0038221 | A1 | 2/2006 | Lee et al. | 2007/0246699 A1 | 10/2007 | Lung |
| 2006/0066156 | A1 | 3/2006 | Dong et al. | 2007/0249090 A1 | 10/2007 | Philipp et al. |
| 2006/0073642 | A1 | 4/2006 | Yeh et al. | 2007/0257300 A1 | 11/2007 | Ho et al. |
| 2006/0081843 | A1* | 4/2006 | Bromberger ............ 257/49 | 2007/0262388 A1 | 11/2007 | Ho et al. |
| 2006/0091476 | A1 | 5/2006 | Pinnow et al. | 2007/0267618 A1 | 11/2007 | Zaidi et al. |
| 2006/0094154 | A1 | 5/2006 | Lung | 2007/0274121 A1 | 11/2007 | Lung et al. |
| 2006/0108667 | A1 | 5/2006 | Lung | 2007/0285960 A1 | 12/2007 | Lung et al. |
| 2006/0110878 | A1 | 5/2006 | Lung et al. | 2007/0298535 A1 | 12/2007 | Lung |
| 2006/0110888 | A1 | 5/2006 | Cho et al. | 2008/0006811 A1 | 1/2008 | Philipp et al. |

| | | | |
|---|---|---|---|
| 2008/0012000 A1 | 1/2008 | Harshfield | |
| 2008/0014676 A1 | 1/2008 | Lung et al. | |
| 2008/0025089 A1 | 1/2008 | Scheuerlein et al. | |
| 2008/0043520 A1 | 2/2008 | Chen | |
| 2008/0094871 A1 | 4/2008 | Parkinson | |
| 2008/0101110 A1 | 5/2008 | Happ et al. | |
| 2008/0137400 A1 | 6/2008 | Chen et al. | |
| 2008/0164453 A1 | 7/2008 | Breitwisch et al. | |
| 2008/0165569 A1 | 7/2008 | Chen et al. | |
| 2008/0165570 A1 | 7/2008 | Happ et al. | |
| 2008/0165572 A1 | 7/2008 | Lung | |
| 2008/0166875 A1 | 7/2008 | Lung | |
| 2008/0179582 A1 | 7/2008 | Burr et al. | |
| 2008/0180990 A1 | 7/2008 | Lung | |
| 2008/0186755 A1 | 8/2008 | Lung et al. | |
| 2008/0191187 A1 | 8/2008 | Lung et al. | |
| 2008/0192534 A1 | 8/2008 | Lung | |
| 2008/0197334 A1 | 8/2008 | Lung | |
| 2008/0224119 A1 | 9/2008 | Burr et al. | |
| 2008/0225489 A1 | 9/2008 | Cai et al. | |
| 2008/0265234 A1 | 10/2008 | Breitwisch et al. | |
| 2009/0001341 A1 | 1/2009 | Breitwisch et al. | |
| 2009/0014704 A1 | 1/2009 | Chen et al. | |
| 2009/0023242 A1 | 1/2009 | Lung | |
| 2009/0027950 A1 | 1/2009 | Lam et al. | |
| 2009/0042335 A1 | 2/2009 | Lung | |
| 2009/0057641 A1 | 3/2009 | Lung | |
| 2009/0166600 A1 | 7/2009 | Park et al. | |

FOREIGN PATENT DOCUMENTS

| | | |
|---|---|---|
| WO | WO-0079539 | 12/2000 |
| WO | WO-0145108 | 6/2001 |
| WO | WO-0225733 | 3/2002 |

OTHER PUBLICATIONS

"Magnetic Bit Boost," www.sciencenews.org, Dec. 18 & 25, 2004, p. 389, vol. 166.

"New Memories Tap Spin, Gird for Battle," Science News, Apr. 3, 1999, p. 223, vol. 155.

"Optimized Thermal Capacitance in a Phase Change Memory Cell Design," IPCOM000141986D, IP.com Prior Art Database, Oct. 18, 2006, 4pp.

"Remembering on the Cheap," www.sciencenews.org, Mar. 19, 2005, p. 189, vol. 167.

"Thermal Conductivity of Crystalline Dielectrics" in CRC Handbook of Chemistry and Physics, Internet Version 2007, (87th edition), David R. Lide, ed. Taylor and Francis, Boca Raton, Fl, 2pp.

Adler, D. et al., "Threshold Switching in Chalcogenide-Glass Thin Films," J. Appl/Phys 51(6), Jun. 1980, pp. 3289-3309.

Adler, David, "Amorphous-Semiconductor Devices," Sci. Amer., vol. 236, pp. 36-48, May 1977.

Ahn, S. J. et al., "A Highly Manufacturable High Density Phase Change Memory of 64 Mb and Beyond," IEEE IEDM 2004, pp. 907-910.

Ahn, S. J. et al., "Highly Reliable 5nm Contact Cell Technology for 256Mb PRAM," VLSI Technology, Digest of Technical Papers, Jun. 14-16, 2005, pp. 98-99.

Atwood, G, et al., "90 nm Phase Change Technology with u Trench and Lance Cell Elements," VLSI Technology, Systems and Applications, Apr. 23-25, 2007, pp. 1-2.

Axon Technologies Corporation paper: Technology Description, published in 1997, pp. 1-6.

Bedeschi, F. et al., "4-MB MOSFET-Selected Phase-Change Memory Experimental Chip," IEEE, 2004, 4 PP.

Blake thesis, "Investigation of GeTeSb5 Chalcogenide Films for Use as an Analog Memory," AFIT/GE/ENG/00M-04, Mar. 2000, 121 pages.

Chao, Der-Sheng, et al., "Low Programming Current Phase Change Memory Cell with Double GST Thermally Confined Structure," Int'l Symp on VLSI Technology, Systems and Applications, Apr. 23-25, 2007, pp. 1-2.

Chen, An et al., "Non-Volatile Resistive Switching for Advanced Memory Applications," IEEE IEDM, Dec. 5-7, 2005, 4 pp.

Cho, S. L. et al., "Highly Scalable On-axis Confined Cell Structure for High Density PRAM beyond 256Mb, " 2005 Symposium on VLSI Technology Digest of Technical Papers, pp. 96-97.

Gibson, G. A. et al., "Phase-change Recording Medium that Enables Ultrahigh-density Electron-beam Data Storage, " Applied Physics Letter, 2005, 3 pp., vol. 86.

Gill, Manzur et al., "A High-Performance Nonvolatile Memory Technology for Stand-Alone Memory and Embedded Applications," 2002 IEEE-ISSCC Technical Digest (TD 12.4), 7 pp.

Gleixner, "Phase Change Memory Reliability", 22nd NVSMW, Aug. 26, 2007, 46 pages.

Ha, Y. H. et al., "An Edge Contact Type Cell for Phase Change RAM Featuring Very Low Power Consumption," 2003 Symposium on VLSI Technology Digest of Technical Papers, pp. 175-176.

Happ, T. D. et al., "Novel None-Mask Self-Heating Pillar Phase Change Memory," 2006 Symposium on VLSI Technology, 2 pp.

Haring Bolivar, P. et al., "Lateral Design for Phase Change Random Access Memory Cells with Low-Current Consumption," presented at 3rd E*PCOS 04 Symposium in Balzers, Principality of Liechtenstein, Sep. 4-7, 2004, 4pp.

Horii, H. et al., "A Novel Cell Technology Using N-doped GeSbTe Films for Phase Change RAM," 2003 Symposium on VLSI Technology Digest of Technical Papers, pp. 177-178.

Hudgens, S. et al., "Overview of Phase-Change Chalcogenide Nonvolatile Memory Technology," MRS Bulletin, Nov. 2004, pp. 829-832.

Hwang, Y. N. et al., "Full Integration and Reliability Evaluation of Phase-change RAM Based on 0.24um-CMOS Technologies," 2003 Symposium on VLSI Technology Digest of Technical Papers, pp. 173-174.

Iwasaki, Hiroko et al., "Completely Erasable Phase Change Optical Disk," Jpn. J. Appl. Phys., Feb. 1992, pp. 461-465, vol. 31.

Jeong, C. W. et al., "Switching Current Scaling and Reliability Evaluation in PRAM," IEEE Non-Volatile Semiconductor Memory Workshop, Monterey, CA 2004, pp. 28-29 and workshop cover sheet.

Kim, Kinam et al., "Reliability Investigations for Manufacturable High Density PRAM," IEEE 43rd Annual International Reliability Physics Symposium, San Jose, 2005, pp. 157-162.

Kojima, Rie et al., "Ge-Sn-Sb-Te Phase-change Recording Material Having High Crystallization Speed," Proceedings of PCOS 2000, pp. 36-41.

Lacita, A. L., "Electrothermal and Phase-change Dynamics in Chalcogenide-based Memories," IEEE IEDM 2004, 4 pp.

Lai, Stefan, "Current Status of the Phase Change Memory and Its Future," IEEE IEDM 2003, pp. 255-258.

Lai, Stephan et al., "OUM-A 180 nm Nonvolatile Memory Cell Element Technology for Stand Alone and Embedded Applications," IEEE IEDM 2001, pp. 803-806.

Lankhorst, Martijn H.R., et al; Low-Cost and Nanoscale Non-Volatile Memory Concept for Future Silicon Chips, Mar. 13, 2005, 6 pp., Nature Materials Advance Online Publication, www.nature.com/naturematerials.

Mott, Nevill, "Electrons in Glass," Nobel Lecture, Dec. 8, 1977, Physics, 1977, pp. 403-413.

Oh, J.H., et al., *Full Integration of Highly Manufacturable 512Mb PRAM based on 90nm Technology*, International Electron Devices Meeting, IEDM '06, Dec. 11-13, 2006 pp. 1-4.

Ovonyx Non-Confidential paper entitled "Ovonic Unified Memory," Dec. 1999, pp. 1-80.

Ovshinsky, Sandford R., "Reversible Electrical Switching Phenomena in Disordered Structures," Physical Review Letters, vol. 21, No. 20, Nov. 11, 1968, pp. 1450-1453.

Owen, Alan E. et al., "Electronic Conduction and Switching in Chalcogenide Glasses," IEEE Transactions on Electron Devices, vol. Ed. 20, No. 2, Feb. 1973, pp. 105-122.

Pellizer, F. et al.,"Novel u Trench Phase-Change Memory Cell for Embedded and Stand-Alone Non-Volatile Memory Applications," 2004 Symposium on VLSI Technology Digest of Technical Papers, pp. 18-19.

Pellizer, F., et al., *A 90nm Phase Change Memory Technology for Stand-Alone non-Volatile Memory Applications*, 2006 Symp. on VLSI Technology Digest of Technical Papers, 2 pages.

Pirovano, Agostino et al.,"Reliability Study of Phase-Change Nonvolatile Memories," IEEE Transactions on Device and Materials Reliability, Sep. 2004, pp. 422-427, vol. 4, No. 3.

Prakash, S. et al., "A guideline for Designing Chalcogenide-Based Glasses for Threshold Switching Characteristics," IEEE Electron Device Letters, vol. 18, No. 2, Feb. 1997, pp. 45-47.

Radaelli, A. et al., "Electronic Switching Effect and Phase-Change Transition in Chalcogenide Materials," IEEE Electron Device Letters, Oct. 2004, pp. 684-686, vol. 25, No. 10.

Risch, Lothar, et al., *Recent Progress With Vertical Transistors*, Proc. of the 27th EP Solid-State Device Research Conference, Sep. 22-24, 1997, pp. 34-41.

Rochefort, C. et al., "Manufacturing of High Aspect-Ration p-n Junctions Using Vapor Phase Doping for Application in Multi-Resurf Devices," IEEE 2002, pp. 237-240.

Schafft, Harry A. et al., "Thermal Conductivity Measurements of Thin Films Silicon Dioxide," Proceedings of the IEEE 1989 International Conference on Microelectronic Test Structures vol. 2, No. 1, Mar. 1989, pp. 121-124.

Strauss, Karl F. et al., "Overview of Radiation Tolerant Unlimited Write Cycle Non-Volatile Memory," IEEE 2000, pp. 399-408.

Subramanian, Vivek et al., "Low Leakage Germanium-Seeded Laterally-Crystallized Single-Grain 100-nm TFT's for Vertical Integration Applications," IEEE Electron Device Letters, vol. 20, No. 7, Jul. 1999, pp. 341-343.

Wicker, Guy et al., Nonvolatile, High Density, High Performance Phase Change Memory, 1999, http://klabs.org/richcontent/MAPLDCon99/Papers/P21_Tyson_P.PDF#search='nonvolatile%20high%20density%20high%20performance%20phase%20change%20memory, 8pages.

Wicker, Guy, "A Comprehensive Model of Submicron Chalcogenide Switching Devices," Doctoral Dissertation, Wayne State University, Detroit, MI 1996, 137 pp.

Wolf, Stanley, Excerpt from: Silicon Processing for the VLSI Era-vol. 4, pp. 674-679, 2004.

Wuttig, Matthias, "Towards a Universal Memory?" Nature Materials, Apr. 2005, pp. 265-266, vol. 4.

Yamada, Noboru, "Potential of Ge-Sb-Te phase-change optical disks for high-data-rate recording in the near future," (Conference Proceedings Paper), Jul. 30, 1997, vol: 3109, 10 pages.

Yi, J. H. et al., "Novel Cell Structure of PRAM with Thin Metal Layer Inserted GeSbTe," IEEE IEDM 2003, 4 pages.

\* cited by examiner

Fig. 5A
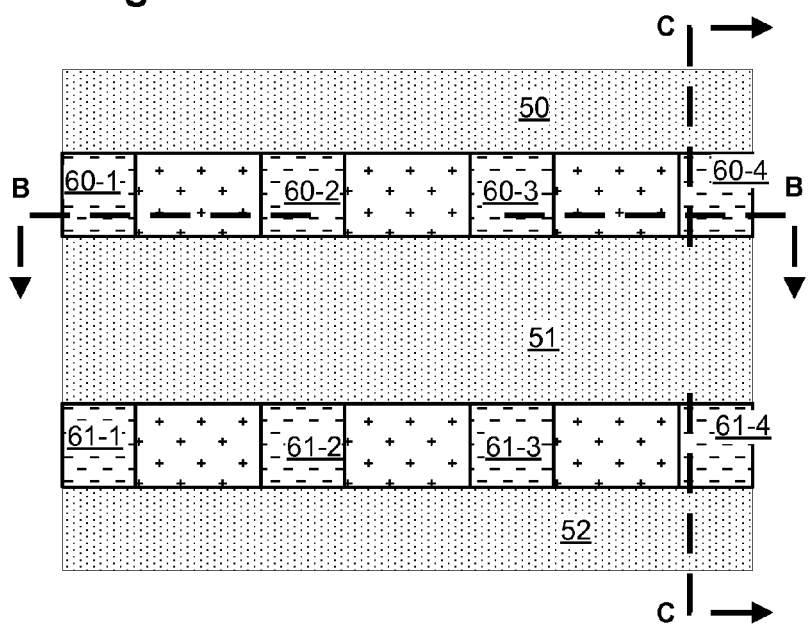
Fig. 5C
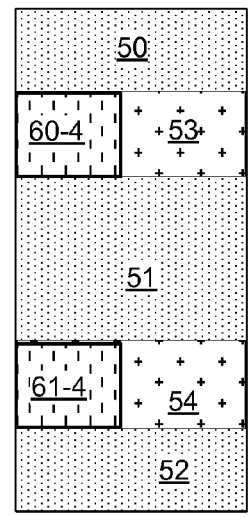
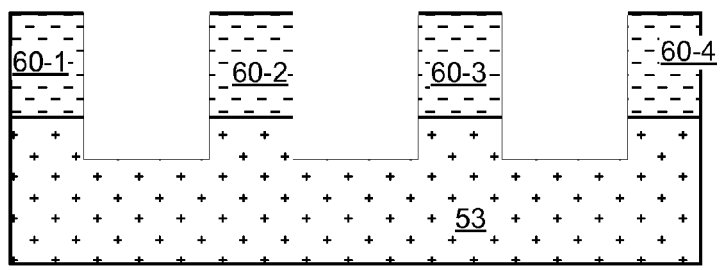
Fig. 5B

Fig. 6A
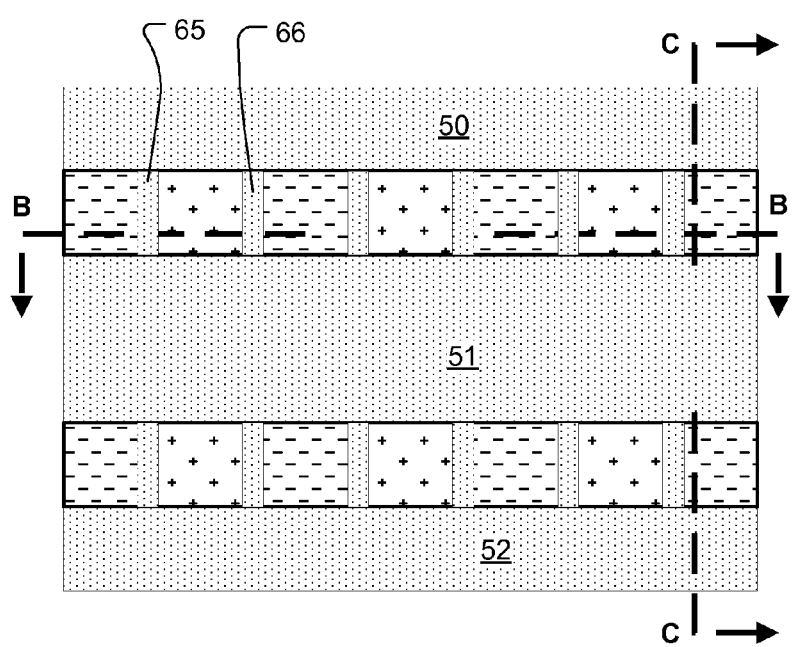
Fig. 6C
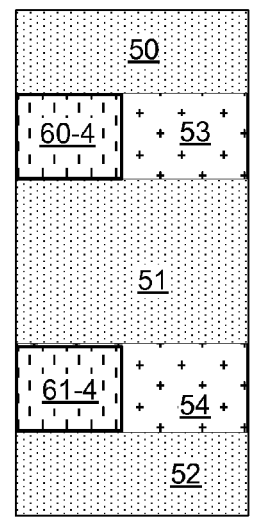
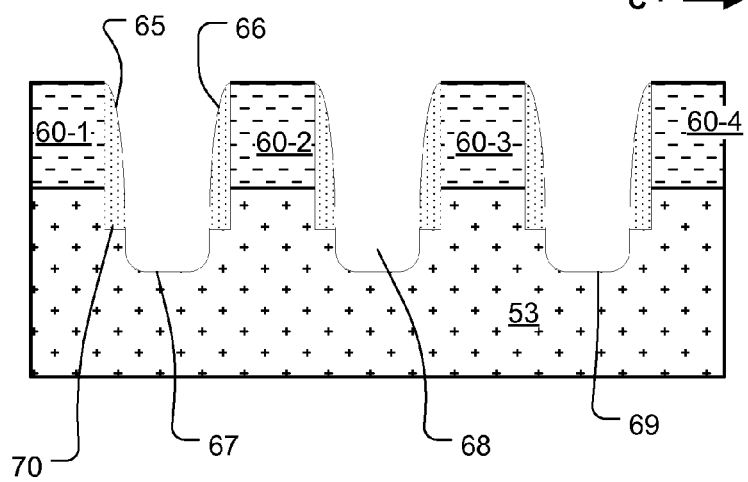
Fig. 6B

Fig. 10A
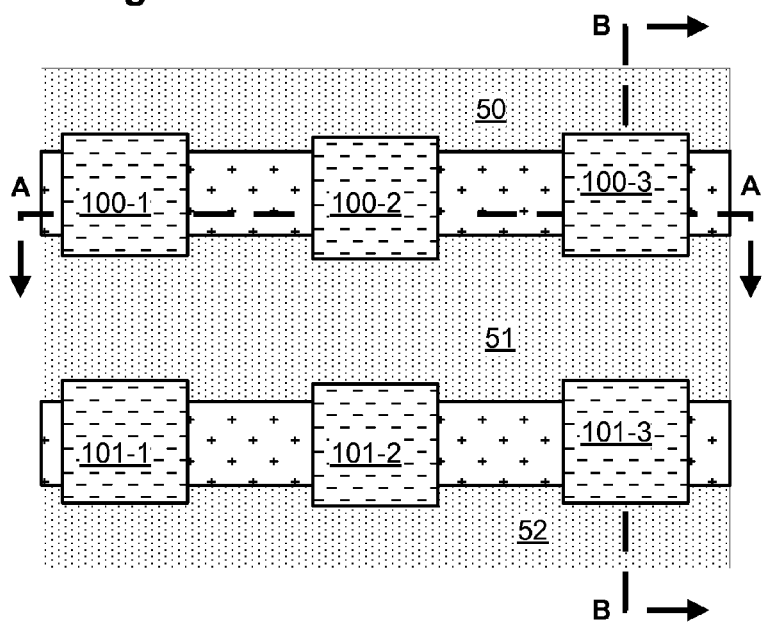
Fig. 10C
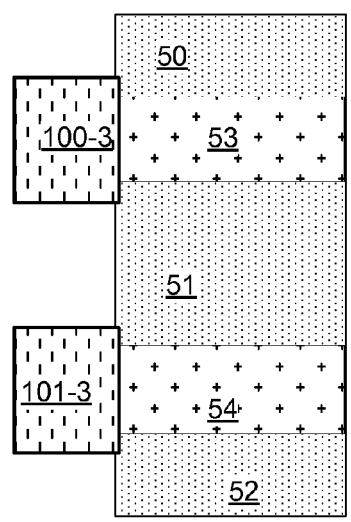
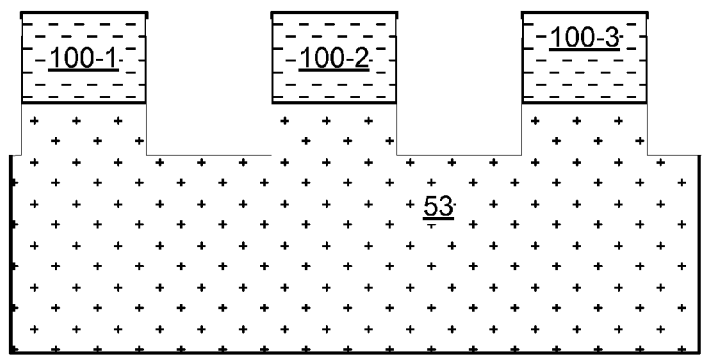
Fig. 10B

INTEGRATED CIRCUIT MEMORY WITH SINGLE CRYSTAL SILICON ON SILICIDE DRIVER AND MANUFACTURING METHOD

PARTIES TO A RESEARCH AGREEMENT

International Business Machines Corporation, a New York corporation and Macronix International Corporation, Ltd., a Taiwan corporation, are parties to a Joint Research Agreement.

BACKGROUND

1. Field of the Invention

The present invention relates to high density memory devices based on phase change based memory materials, including chalcogenide based materials, and other programmable resistance materials, and to methods for manufacturing such devices.

2. Description of Related Art

Phase change based memory materials, such as chalcogenide based materials and similar materials, can be caused to change phase between an amorphous state and a crystalline state by application of electrical current at levels suitable for implementation in integrated circuits. The generally amorphous state is characterized by higher electrical resistivity than the generally crystalline state, which can be readily sensed to indicate data. These properties have generated interest in using programmable resistive material to form nonvolatile memory circuits, which can be read and written with random access.

The change from the amorphous to the crystalline state is generally a lower current operation. The change from crystalline to amorphous, referred to as reset herein, is generally a higher current operation, which includes a short high current density pulse to melt or breakdown the crystalline structure, after which the phase change material cools quickly, quenching the phase change process and allowing at least a portion of the phase change material to stabilize in the amorphous state. The magnitude of the current needed for reset can be reduced by reducing the size of the phase change material element in the cell and/or the contact area between electrodes and the phase change material, such that higher current densities are achieved with small absolute current values through the phase change material element.

Because the phase change occurs as a result of heating, a relatively large current is needed in order to heat the phase change material and induce the desired phase change. Field effect transistor access devices have been proposed as drivers for phase change memory cells, but field effect transistors (e.g., MOSFET) can have a weaker current drive. Bipolar junction transistors (BJT) can provide larger current drive than field effect transistors, but the integration of bipolar junction transistors with CMOS peripheral circuitry is difficult and results in highly complex designs and manufacturing processes. See, Pellizzer, F., et al., "A 90 nm Phase Change Memory Technology for Stand-Alone Non-Volatile Memory Applications," 2006 Symp. on VLSI Technology Digest of Papers, IEEE 2006.

Diode access devices have been proposed as drivers for phase change memory cells. See, Oh, J. H., et al., "Full Integration of Highly Manufacturable 512 Mb PRAM based on 90 nm Technology," IEDM 2006, Page(s): 1-4. However, diodes having both regions made of doped polysilicon may have an unacceptably high off current. Diodes having both regions made of doped single-crystal silicon may provide a suitably low off current, but processes for making a diode having both regions made of doped single-crystal silicon are complex. Diode structures have been proposed that include polysilicon for one terminal and single-crystal silicon for another. See, U.S. Pat. No. 7,309,921. However, such structures do not completely solve the problem of high off-current due to the polysilicon terminal, and have not been proposed for memory cell access devices. See, U.S. Pat. No. 7,157,314.

One common technology for interconnecting components on integrated circuits requires the use of buried diffusion lines, which consist of lines of implanted dopants in relatively high concentration, so that they act as conductors in the substrate. A problem that arises with the use of buried diffusion lines or other doped semiconductor features is the formation of parasitic devices. Semiconductor regions that are adjacent the buried diffusion lines can produce carriers during operation. These carriers can migrate into the buried diffusion lines, and activate parasitic devices causing breakdown or current leakage.

Silicides are commonly used in integrated circuit manufacturing to increase the conductivity of doped silicon lines or elements. A common version of the material is referred to as a "salicide", changing the first two letters of the word to "sa-", in a reference to self-aligned techniques for forming the material on the chip. A self-aligned process for forming silicide involves depositing a silicide precursor over a substrate that includes exposed regions of silicon, and annealing the silicide precursor to form a silicide in the exposed regions. Then the remaining silicide precursor on the substrate is removed leaving the self-aligned silicide elements. Typical silicide precursors include metals or combinations of metals such as cobalt, titanium, nickel, molybdenum, tungsten, tantalum, and platinum. Also, silicide precursors may include metal nitrides or other metal compounds. Representative uses of silicides in integrated circuit manufacturing are shown in U.S. Pat. Nos. 7,365,385; 7,129,538; 6,815,298; 6,737,675; 6,653,733; 6,649,976 and 6,011,272; and in U.S. Patent Application Publication No. US 2001/0055838.

One limitation on the utilization of silicides arises because there is no practical technique for providing a single crystal silicon node on top of a silicide, or for providing a silicide between two single crystal nodes of silicon, without intervening layers of material. (Compare for example, European Patent Application Publication No. 0 494 598 A1). When forming a silicon element on top of a silicide, only amorphous or polycrystalline silicon have been made in prior art technologies. Thus, certain types of devices, such as diode drivers for memory cells, in which it is preferable to utilize single crystal silicon cannot be formed on top of a silicide contact. This limitation arises in the formation of vertical access devices such as diodes and transistors in memory arrays, and in other vertical device structures.

It is desirable to provide access devices that reliably provide sufficient current for programmable resistance memory cell programming while avoiding problems of cross-talk, that are readily manufacturable at acceptable cost, and that are compatible with high performance logic circuitry.

SUMMARY

A memory device is described that includes a diode driver and a data storage element, and in which the diode driver comprises a silicide element on a silicon substrate with a single crystal silicon node on the silicide element. The silicide element separates the single crystal silicon node from the underlying silicon substrate, and is capable of acting as a conductive element for interconnecting devices on the device. The single crystal silicon node acts as one terminal of a diode, and a second semiconductor node is formed on top of it, acting as the other terminal of the diode.

Also, an integrated circuit memory device is described that comprises a single crystal silicon body having a top surface, and a plurality of protruding elements that consist of single crystal silicon features protruding from the top surface of the body. A silicide conductor has first portions on the top surface of the body between the protruding elements, and second portions abutting the first portions so as to form a continuous conductor, which extends through the protruding elements, and acts as a buried word line, or other access line, for data storage elements coupled to the protruding elements. The silicide conductor then separates remaining portions of the protruding elements, which consist of single crystal silicon features, from the underlying single crystal silicon body. The protruding elements include diodes that act as drivers for data storage elements that are connected between the diodes and a bit line, or other access line, for an array of data storage elements.

A manufacturing method is described that includes providing a single crystal silicon body, and forming a protruding element on the single crystal silicon body that includes a pn-junction, or alternatively includes a semiconductor node coupled to the protruding element forming a pn-junction. A silicide precursor is deposited on the single crystal silicon body adjacent the protruding element. The structure is annealed to induce formation of silicide by reaction of the silicide precursor with the single crystal silicon body. The silicide formation consumes the silicon of the single crystal silicon body until the silicide forms a conductor separating the remaining portions of the protruding element from an underlying portion of the single crystal silicon body. As a result, a pn-junction including a single crystal silicon node is formed on top of the underlying silicide, and is separated from the underlying single crystal silicon body on the silicide. A data storage element is provided in series between the pn-junction, which acts as a diode driver, and an overlying bit line.

In an embodiment of the manufacturing method described herein, a sidewall blocking layer is formed on the sides of the protruding element, and an etching step is executed, which etches into the single crystal silicon body using the sidewall blocking layer as a mask to expose a portion of the single crystal silicon body beneath the sidewall blocking layer. The portions of the single crystal silicon body beneath the sidewall blocking layer are consumed by the silicide formation, while the blocking layer protects the upper portions of the protruding element including the region in which the pn-junction is formed, from silicide formation. Thereby, the upper portion of the protruding element remains in a single crystal state, and becomes separated from the underlying single crystal silicon body by the silicide formed beneath it. The silicide made using this process is integral with the underlying silicon body and the overlying silicon node, in the sense that the formation of silicide by consuming the silicon integrates the silicide within the single crystal silicon body and protruding elements. This integral nature of the silicide provides a silicon/silicide interface with excellent electrical and structural characteristics.

A process for forming a pn-junction on the single crystal silicon node includes implanting dopants having a conductivity type opposite that of the single crystal silicon node into the upper surface of the single crystal silicon node. As a result, a second single crystal silicon node is formed in contact with the first single crystal silicon node with a pn-junction therebetween within the protruding element. In an alternative process for forming a pn-junction on the single crystal silicon node, a second semiconductor node can be deposited and patterned on top of the protruding element. The second semiconductor node will have a conductivity type opposite that of the single crystal silicon node, and establish a pn-junction therebetween.

Other aspects and advantages of the technology described herein can be seen with reference to the figures, the detailed description and the claims which follow.

BRIEF DESCRIPTION OF THE DRAWINGS

FIGS. 5A-5C are a plan view, a horizontal cross-section view and a vertical cross-section view, respectively, of a work piece during a next stage after etching to form protruding elements on the elongated silicon structures in the first representative process.

FIGS. 6A-6C are a plan view, a horizontal cross-section view and a vertical cross-section view, respectively, of a work piece during a next stage after sidewall formation and deeper etching between the sidewalls into the elongated silicon structures in the first representative process.

FIGS. 10A-10C are a plan view, a horizontal cross-section view and a vertical cross-section view, respectively, of a work piece during an alternative to the implant step of FIGS. 4A-4C where polysilicon nodes are deposited over the protruding elements on the elongated silicon structures.

DETAILED DESCRIPTION

Figure 1:
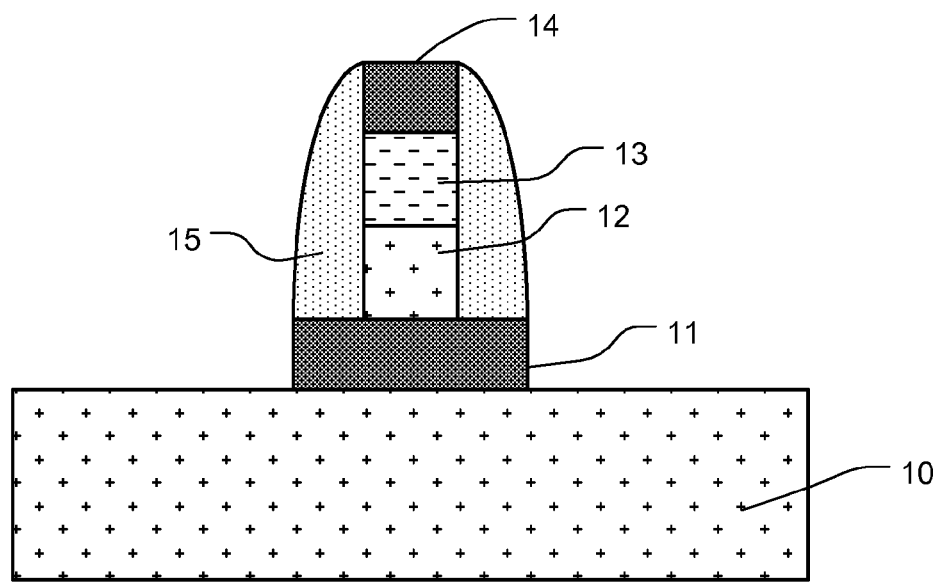
FIG. 1 is a simplified drawing of an integrated circuit component having a single crystal silicon node on top of a silicide element.

FIG. 1 illustrates an integrated circuit device formed on a single crystal silicon body 10, such as an epitaxial silicon layer in a silicon-on-insulator structure or a bulk silicon substrate. The device includes a silicide element 11, on top of which is a single crystal silicon node 12. A second semiconductor node 13 having a conductivity type opposite that of the single crystal silicon node 12 contacts the single crystal silicon node 12 forming a pn-junction therebetween. In the illustrated structure, a silicide cap 14 is formed on a second semiconductor node 13. Sidewall structures 15 isolate the pn-junction device from surrounding structures not shown. In the example of FIG. 1, a diode is shown using a single crystal silicon node 12 as one of the anode and cathode of the device. The single crystal silicon node 12 can be utilized in a variety of other structures as well, including transistors, and as a substrate on which additional layers can be formed which benefit from the single crystal nature of the node 12. Likewise, the node shown in cross-section in FIG. 1, can be elongated in a fence-type shape, or configured as a pillar.

Figure 2:
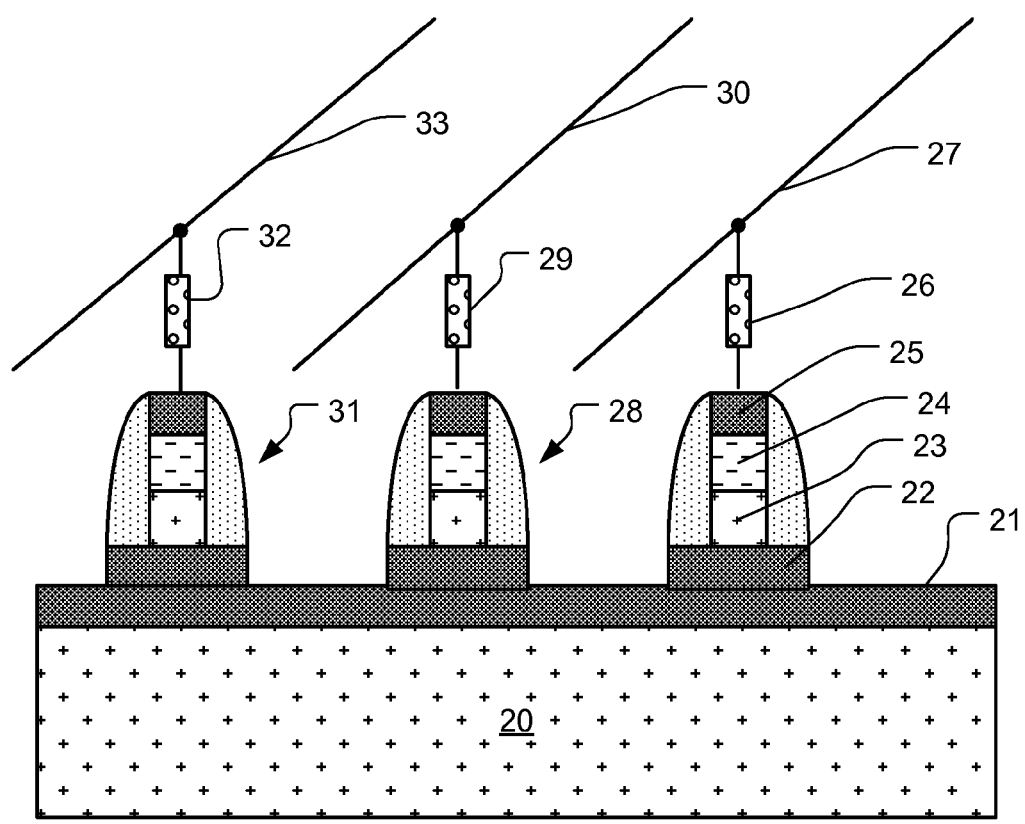
FIG. 2 illustrates an array of drivers for data storage elements including diodes having single crystal silicon nodes on top of silicide conductors.

FIG. 2 illustrates one example application of a single crystal silicon node on a silicide element. Specifically, FIG. 2 shows an arrangement of diodes implemented as shown in FIG. 1, used as drivers for data storage elements and in a memory array. Thus, a semiconductor body 20 has a silicide conductor 21 on its surface. A silicide element 22 underlies a single crystal silicon node 23 having for example a p-type conductivity. A second silicon node 24 overlies the single crystal silicon node 23, and has the opposite conductivity, for example an n-type conductivity. A silicide cap 25 provides a contact to the diode. A data storage element 26 is arranged between the silicide cap 25 and an overlying access line 27. A similar diode 28 is coupled to the silicide conductor 21, and acts as a driver for the data storage element 29, which is arranged between the diode 28 and the access line 30. Likewise, a similar diode 31 acts as a driver for the data storage element 32, which is arranged between the diode 31 and the access line 33.

The data storage element 26 in one embodiment comprises a phase change material. The data storage element 26 may comprise other programmable resistive materials, and other types of memory technologies that are compatible with diode drivers as described herein.

Figure 3A:
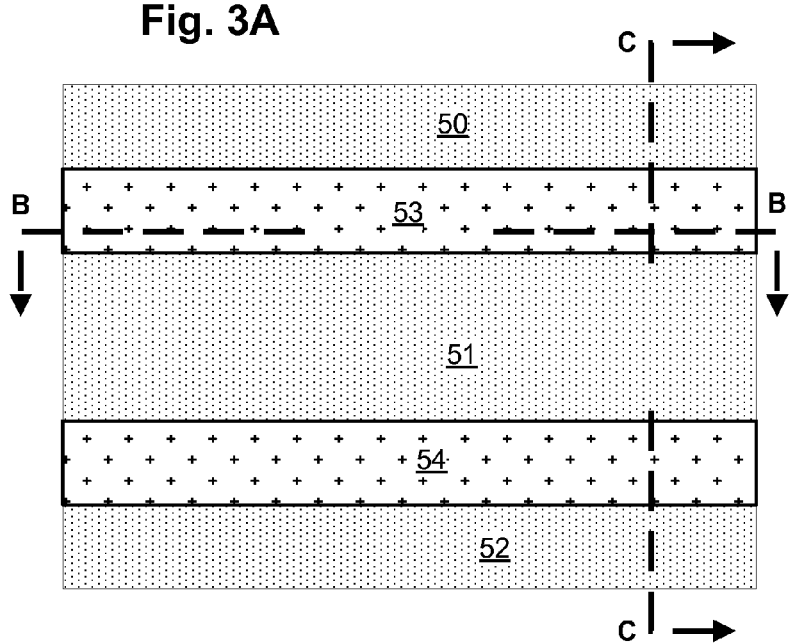
FIGS. 3A-3C are a plan view, a horizontal cross-section view and a vertical cross-section view, respectively, of a work piece during a stage after making isolation structures and elongated silicon structures of a first representative process for making an integrated circuit memory diode driver having a single crystal silicon node on top of a silicide element.
Figure 3C:
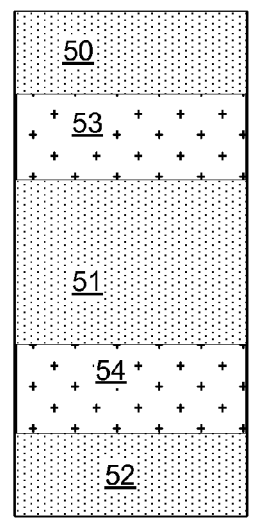
Figure 3B:
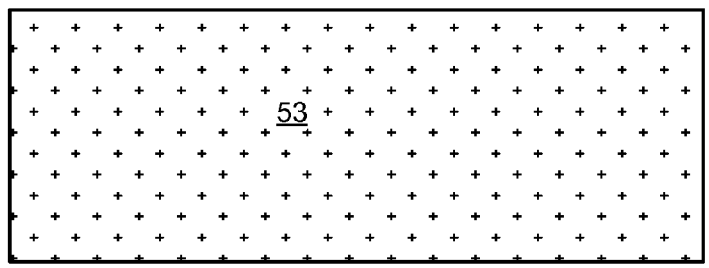

FIGS. 3A-3C are a plan view, a horizontal cross-section view and a vertical cross-section view, respectively, of a work piece during a stage after making isolation structures 50, 51, 52 and elongated silicon structures 53, 54 of a first representative process for making an integrated circuit component having a single crystal silicon node on top of a silicide element. The isolation structures 50, 51, 52 can comprise a silicon dioxide, other insulating material or combinations of materials. The isolation structures 50, 51, 52 and elongated silicon structures 53, 54, can be implemented for example, using shallow trench isolation technology or using patterning technology used in silicon-on-insulator SOI processes. In this example, each of the elongated silicon structures 53, 54 can be considered a single crystal silicon substrate, as seen in the cross-section along structure 53 in FIG. 3B. FIG. 3C shows elongated silicon structures 53 and 54 completely separated from one another. In other embodiments, elongated silicon structures 53 and 54 may be coupled to a silicon body (not shown) below the isolation structures 50, 51, 52. For one embodiment, the elongated structures extend in a word line direction, and buried silicide word lines are formed thereon as described below.

Figure 4A:
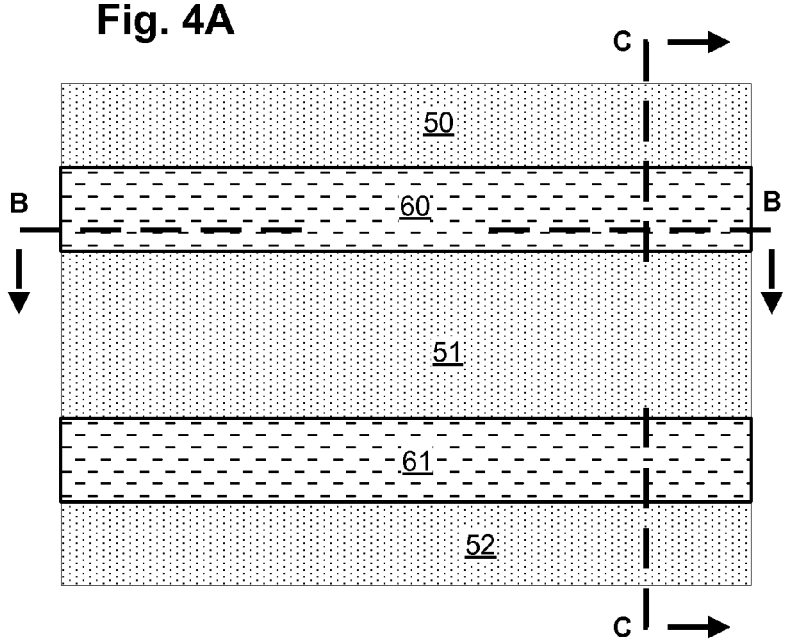
FIGS. 4A-4C are a plan view, a horizontal cross-section view and a vertical cross-section view, respectively, of a work piece during a next stage after doping implants in the elongated silicon structures in the first representative process.
Figure 4C:
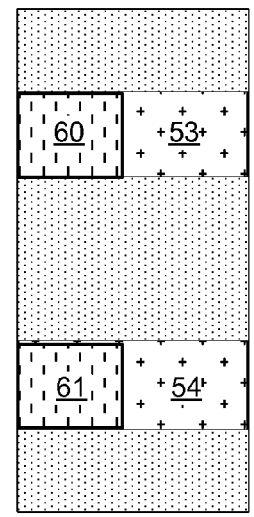
Figure 4B:
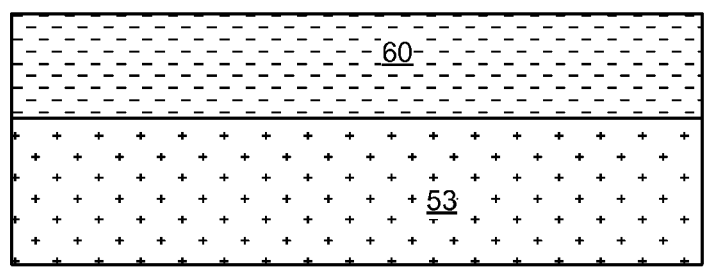

FIGS. 4A-4C are a plan view, a horizontal cross-section view and a vertical cross-section view, respectively, of a work piece during a next stage after doping implants in the elongated silicon structures 53 and 54 in the first representative process, to form second silicon nodes 60, 61 of a conductivity type opposite to that of the elongated silicon structures 53, 54 in doped regions near the surfaces of the structures. For example, if the elongated silicon structures 53, 54 have a p-type conductivity with a concentration sufficient to form an anode of a diode structure, the second silicon nodes 60, 61 are implanted with an n-type dopant with an energy and concentration sufficient to form a cathode of a diode structure.

FIGS. 5A-5C are a plan view, a horizontal cross-section view and a vertical cross-section view, respectively, of a work piece during a next stage after etching to form protruding elements 60-1 through 60-4 and 61-1 through 61-4 on the elongated silicon structures 53, 54 in the first representative process. The protruding elements 60-1 through 60-4 and 61-1 through 61-4 can be formed by defining a pattern of stripes orthogonal to the elongated structures 53 and 54, and applying a selected etch to form rows (along the elongated structures 53, 54) and columns (orthogonal to the elongated structures 53, 54) of protruding elements separated by trenches which do not completely cut through the elongated structures 53, 54, but are deep enough to separate the second of silicon nodes 60-1 through 60-4, as illustrated in FIG. 5B. The stripes are arranged in one embodiment to define columns along overlying bit lines in a memory array.

FIGS. 6A-6C are a plan view, a horizontal cross-section view and a vertical cross-section view, respectively, of a work piece during a next stage after formation of sidewall blocking layers (e.g. 65, 66) and deeper etching between the sidewall blocking layers into the elongated silicon structures making trenches 67, 68, 69 into the single crystal silicon structures 53, 54 deeper than the sidewalls, extending below the lower boundary 70 of the sidewall blocking layer 65, and other sidewall structures as shown in the drawing. The sidewall blocking layers can comprise a material that acts to block silicide formation on the upper portions of the protruding elements, such as silicon oxide, silicon nitride, or another material chosen for compatibility with the silicide formation processes.

Figure 7A:
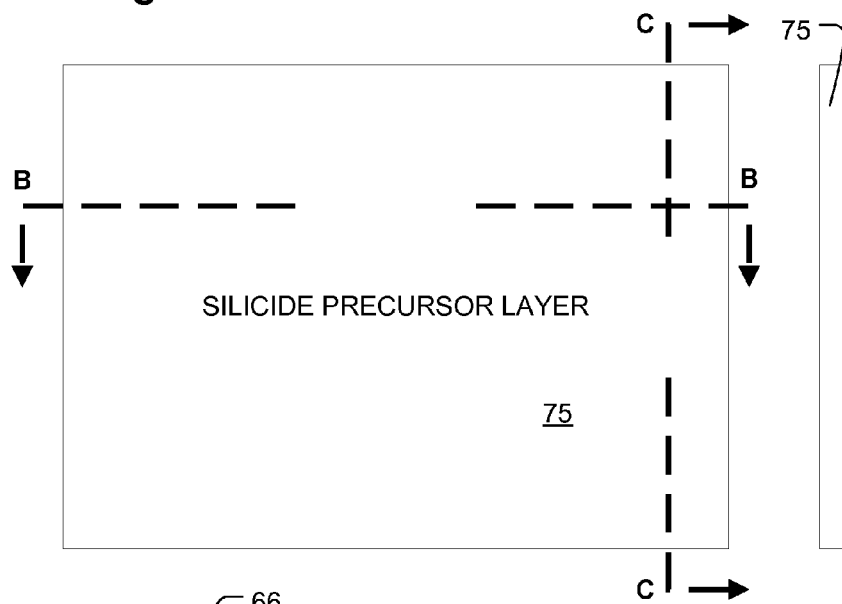
FIGS. 7A-7C are a plan view, a horizontal cross-section view and a vertical cross-section view, respectively, of a work piece during a next stage after silicide precursor deposition over the work piece in the first representative process.
Figure 7C:
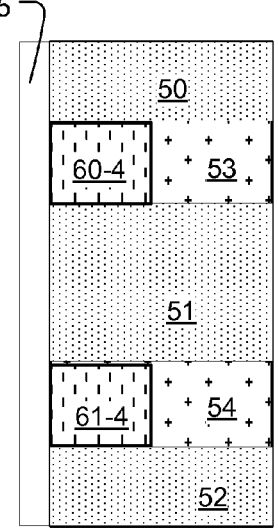
Figure 7B:
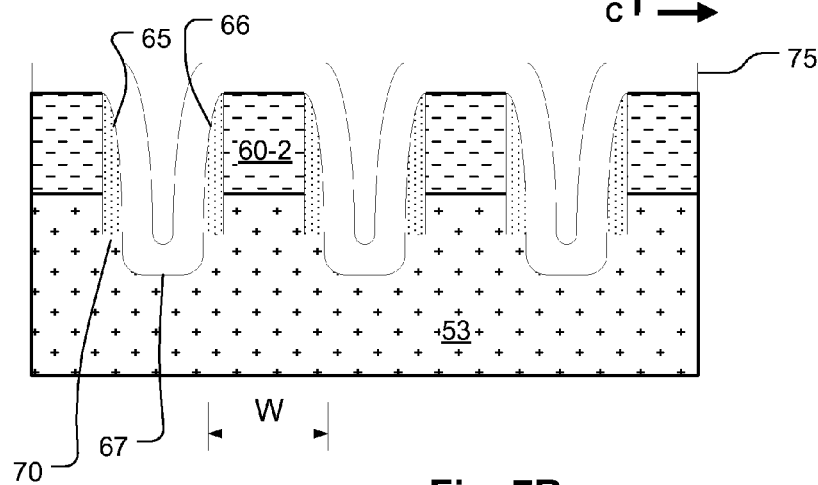

FIGS. 7A-7C are a plan view, a horizontal cross-section view and a vertical cross-section view, respectively, of a work piece during a next stage after deposition of a silicide precursor in a layer 75 over the work piece. The layer 75 of the silicide precursor is conformal with the trenches 67. The sidewall blocking layers 65, 66 separate the layer 75 from the protruding elements along a length that is deeper than the extent of the upper silicon nodes (e.g. 60-2). The thickness of layer 75 depends on the silicide formation dynamics with the underlying silicon body 53, and the width W along the horizontal dimension shown in FIG. 7B of the bases of the protruding elements below the sidewall blocking layers 65, 66. There should be sufficient silicide precursor in layer 75 to cause silicide formation through more than half the width W in the silicon body 53 so that silicide growth into the silicon body 53 on both sides of a protruding element connects beneath the single crystal protruding elements. The amount of silicide precursor and the maximum width W that can be implemented depend on the particular silicide chosen, and the depth of growth of the silicide into the body.

As a basic reference, typical silicide growth has been characterized as forming silicide that is about 2.5 times thicker than the precursor, with growth into the underlying silicon being about 1.5 times the thickness of the precursor. So, if the width W is about 300 nanometers, the thickness of the precursor should be, with this basic reference, about 120 nanometers. With 120 nanometers of precursor, the silicide would grow into the body 53 about 180 nanometers. Thus, the silicide growth from both sides of the protruding elements will merge, with a margin of about 30 nanometers on a side.

Figure 8A:
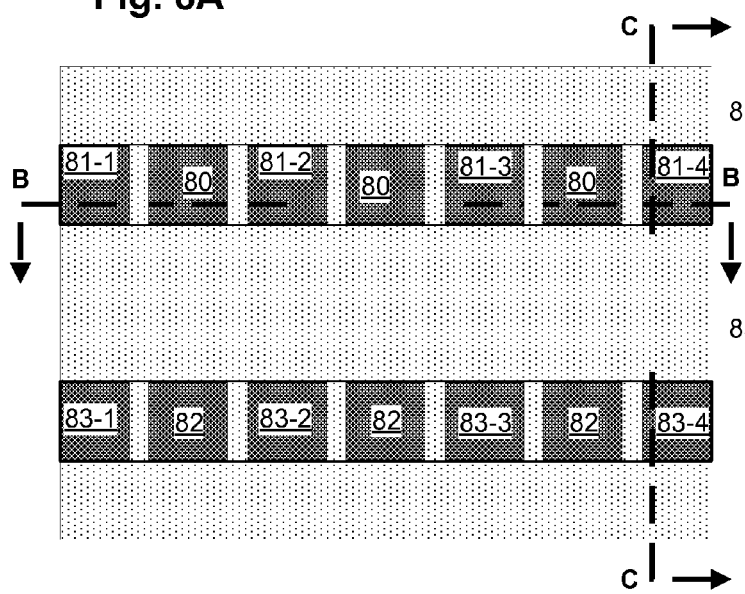
FIGS. 8A-8C are a plan view, a horizontal cross-section view and a vertical cross-section view, respectively, of a work piece during a next stage after annealing to form silicide and cleaning of excess precursor material in the first representative process.
Figure 8C:
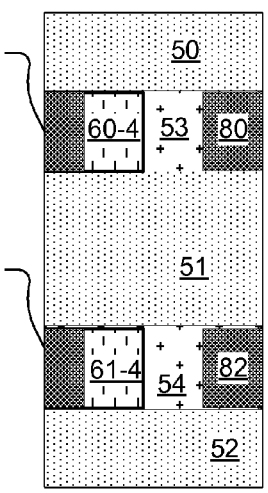
Figure 8B:
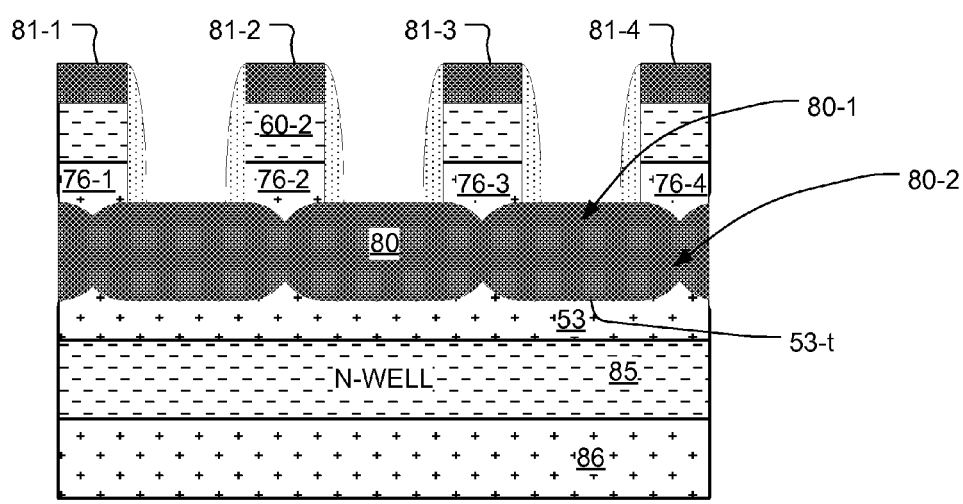

FIGS. 8A-8C are a plan view, a horizontal cross-section view and a vertical cross-section view, respectively, of a work piece during a next stage after annealing to form silicide and cleaning the excess precursor material. The silicide precursor in layer 75 reacts with the single crystal silicon structures 53, 54 in the region below the sidewalls consuming the single crystal silicon until the silicide growth from opposing sides of the protruding structures merges to form a single silicide conductor 80, 82 along their respective elongated silicon structures 53, 54. As illustrated in FIG. 8B, this silicide growth from opposing sides of the elongated silicon structures 53, 54, results in the silicide conductor 80 separating single crystal silicon nodes 76-1 through 76-4 from underlying single crystal substrate 53 (e.g. elongated silicon structure). Thus, the single crystal silicon nodes 76-1 through 76-4 lie on an underlying silicide element 80, which can act as a conductor coupling the single crystal silicon nodes together, while preventing migration of carriers from the single crystal silicon nodes 76-1 to 76-4 into the bulk single crystal substrate. In the embodiment illustrated, the protruding elements are pillar-like, because of their formation on the elongated silicon bodies, and the resulting silicide element 80 is elongated to form a conductive line. In other embodiments, the protruding elements can be fence-like when formed on a silicon body without the shallow trench isolation features. In the fence-like embodiment, the resulting silicide element takes the form of a conductive plane, rather than a conductive line.

Thus, the silicide element 80 is a silicide conductor having first portions 80-1 on the top surface 53-t of the body between protruding single crystal silicon elements in the plurality of single crystal silicon elements, and second portions 80-2 abutting adjacent first portions 80-1, and extending through the protruding single crystal silicon elements, whereby single crystal silicon nodes on protruding single crystal silicon elements are separated from the single crystal silicon body by the silicide conductor.

In the structure illustrated, the silicide also forms caps 81-1 through 81-4 and 83-1 through 83-4 on the second semiconductor nodes, providing a contact for coupling the resulting diode to other structures on the integrated circuit. In an alternative embodiment, the tops of the second semiconductor nodes 60-1 through 60-4 can be capped using silicon nitride or other material to protect it from the silicide process. In this way, different silicide could be used for the caps, or other structures can be implemented on top and in contact with the second semiconductor nodes 60-1 through 60-4.

FIG. 8B also illustrates one example structure for isolating the single crystal silicon structure 53 from an underlying substrate. Specifically, assuming the single crystal structure 53 has a p-type conductivity, is implemented within a deeper n-type well 85, which is in turn formed in a p-type bulk substrate 86, the n-well 85 can be patterned in a manner that isolates groups of elements or single elements, as suits a particular implementation. As mentioned above, in another alternative, the elongated single crystal silicon structures 53, 54 are formed on an underlying insulator such as a silicon dioxide layer, using silicon-on-insulator techniques or the like.

Figure 9:
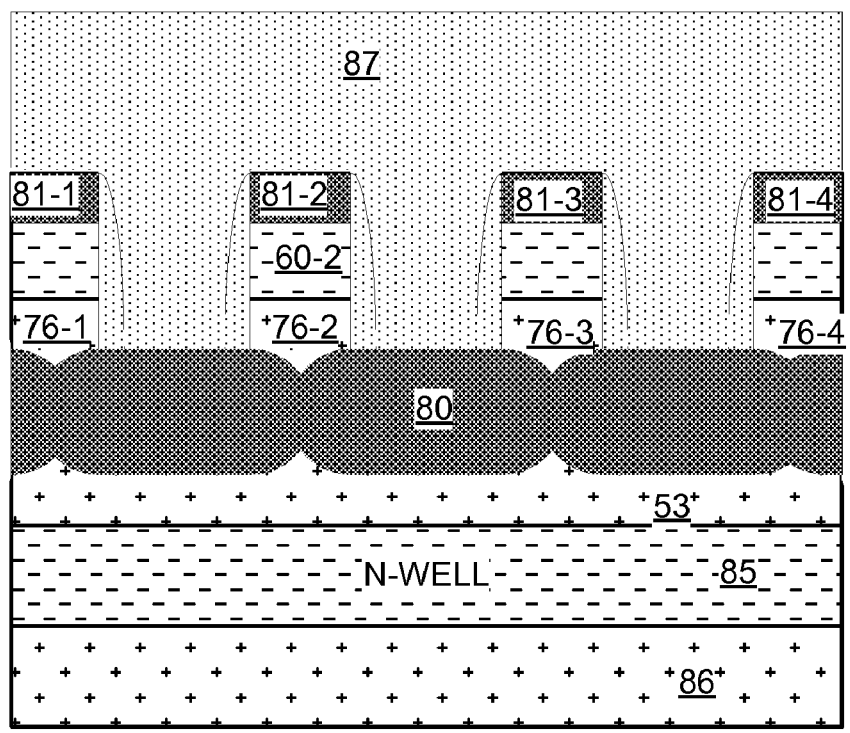
FIG. 9 is a horizontal cross-section view of a work piece during a next stage after depositing an interlayer dielectric fill on the work piece in the first representative process.

FIG. 9 is a horizontal cross-section view 13 of a work piece during a next stage after depositing an interlayer dielectric fill 87. The fill 87 can comprise one or more layers of silicon dioxide or other insulating materials such as boron-doped phospho-silicate glass (BPSG), phospho-silicate glass (PSG) and other common interlayer dielectric materials. The fill 87 serves to isolate the devices formed using the single crystal silicon nodes 76-1 through 76-4 on the silicide conductor 80.

Additional integrated circuit manufacturing processes can be applied to couple the caps 81-1 through 81-4 to data storage elements as shown in FIG. 2, or to overlying conductors and devices to complete an integrated circuit.

FIGS. 10A-10C are a plan view, a horizontal cross-section view and a vertical cross-section view, respectively, of a work piece during an alternative to the implant step of FIGS. 4A-4C where polysilicon nodes 100-1 through 100-3 and 101-1 through 101-3 are deposited and patterned over the elongated silicon structures 53, 54, and elongated silicon structures 53, 54 are etched to form protruding elements with trenches therebetween, as shown in FIG. 10B. The processes of FIGS. 5A-5C through FIG. 9 can be carried out without modification using this alternative technique.

Figure 11:
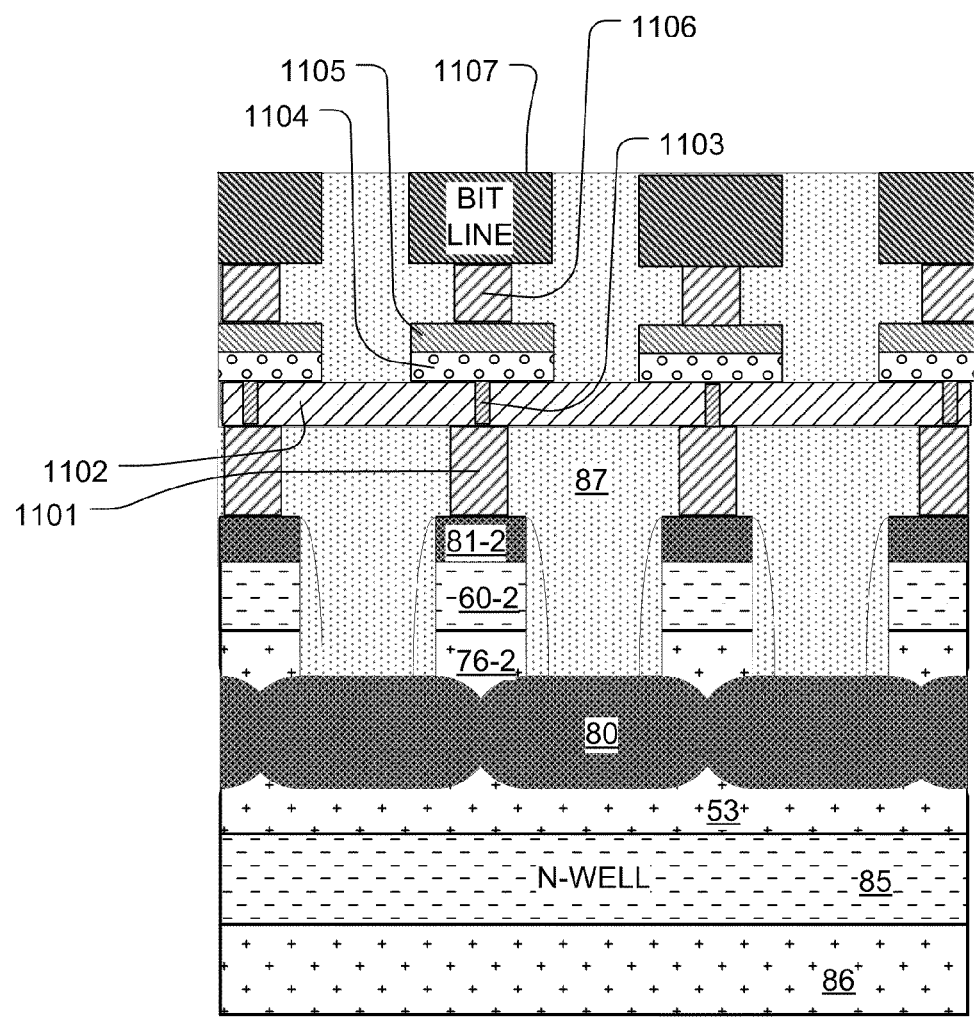
FIG. 11 illustrates a stage in manufacturing a "mushroom" style, phase change data storage element on the diode driver of FIG. 9.

FIG. 11 is a cross-section showing a stage in manufacturing of an integrated circuit memory where "mushroom" style data storage elements are coupled between the silicide word line 80, with diode drivers as shown in FIG. 9, and overlying bit lines (e.g. bit line 1107). Elements shown in FIG. 9 are given the same reference numerals in FIG. 11, and are not described again. The structure shown in FIG. 11 can be made by first forming an array of conductive plugs (e.g. plug 1101) through the interlayer dielectric fill 87, and in contact with corresponding silicide caps (e.g. cap 81-2) in the array of diode drivers. In a representative process, a tungsten plug technology is utilized to make the plug 1101. Next, a layer 1102 of a dielectric such as silicon nitride is formed over the plugs. Electrode elements 1103 are patterned and formed through the layer 1102, and contacting the plugs 1101. In one process for making the electrodes 1103, an opening is formed over the plug 1101, and sidewalls are formed within the opening, which narrow the opening. An electrode material such as titanium nitride is then deposited within the opening to form the electrode element 1103. The resulting structure can be planarized to improve the characteristics of the top surface of the layer 1102 and electrode 1103. A wide variety of techniques can be utilized to form small electrodes such as electrode 1103.

One example manufacturing process for implementing the data storage element includes providing an array of contacts such as provided by the plugs through the fill layer 87, including plug 1101, or alternatively omitting the plugs 1101 and using the silicide caps (e.g. cap 81-2) directly or with a metal layer covering them. A separation layer is formed over the array of contacts, acting to separate the array of contacts from data storage elements. The separation layer may comprise an etch stop material such as silicon nitride in a representative embodiment. Next, a patterning layer using a material such as silicon dioxide or similar material chosen for etching characteristics that differ from those of the separation layer is formed over the separation layer. An array of mask openings is formed in the patterning layer using a lithographic process. The mask openings are formed using a process, which stops at the surface of or within the separation layer. Next, etch masks are formed within the mask openings using a process that compensates for variations in the array of mask openings. One technique for forming the etch masks includes forming a sacrificial layer over the patterning layer, and wherein the process of forming the mask openings includes forming first upper opening segments within the sacrificial layer and second lower opening segments within the patterning layer. The first and second opening segments are formed so that they have first and second widths so that the sacrificial layer has an overhanging portion extending into the openings. Thus, the width of the opening in the sacrificial layer is less than the width of the opening in the patterning layer. A fill material, such as silicon, is deposited within the openings by a process causing formation of voids within the lower opening segments having width determined by the difference between the first and second widths. The fill material is anisotropically etched to open the voids, and then through the fill material at the bottom of the voids to expose the separation layer. In this manner, the exposed areas have widths substantially equal to the widths of the voids. The sidewalls of fill material on the sides of the lower opening segments define the etch masks. In this manner, the variation in the size of the openings defined by the etch masks depends on the dimension of the overhang, caused by the difference between the first and second widths. This dimension is independent of, and can be controlled over a range much less than, the variation in the size of the mask openings, and the variation in size of other features, such as the width of the data storage elements, caused by the lithographic process. The etch masks are used to etch electrode openings through the separation layer. Then, electrode material is deposited into the electrode openings to form an array of bottom electrodes contacting corresponding contacts in the array of contacts. See, for example the electrode and data storage element formation processes described in United States Patent Application entitled PHASE CHANGE MEMORY ARRAY WITH SELF-CONVERGED BOTTOM ELECTRODE AND METHOD FOR MANUFACTURING; application Ser. No. 11/855,983; filed 14 Sep. 2007, which is arose from the same joint development agreement as the present application, and is incorporated by reference as if fully set forth herein.

After formation of the array of electrodes including electrode 1103, a layer of phase change material 1104 (or other programmable resistant material) and top electrode material 1105 is formed and patterned in lines that extend into and out of the drawing. Alternatively, the layer of phase change material 1104 and top electrode layer material 1105 can be patterned in patches, where each patch is coupled to one or a small number of electrode elements. In the structure shown, after patterning the phase change material 1104 and top electrode layer material 1105, an interlayer fill is deposited over the structure, and an additional array of plugs, including plug 1106, is formed using tungsten plug technology or other interlayer conductor techniques. Bit lines, including bit line 1107, are then formed overlying the structures, and in contact with the array of plugs, including plug 1103.

Therefore, a data storage element (1103, 1104) is formed between a bit line 1107 and an underlying silicide word line 80, with a diode driver that includes a single crystal silicon node 76-2 on the word line 80.

Embodiments of the programmable resistive material of the data storage element 1104 include phase change based memory materials, including chalcogenide based materials and other materials. Chalcogens include any of the four elements oxygen (O), sulfur (S), selenium (Se), and tellurium (Te), forming part of group VIA of the periodic table. Chalcogenides comprise compounds of a chalcogen with a more electropositive element or radical. Chalcogenide alloys comprise combinations of chalcogenides with other materials such as transition metals. A chalcogenide alloy usually contains one or more elements from group IVA of the periodic table of elements, such as germanium (Ge) and tin (Sn). Often, chalcogenide alloys include combinations including one or more of antimony (Sb), gallium (Ga), indium (In), and silver (Ag). Many phase change based memory materials have been described in technical literature, including alloys of: Ga/Sb, In/Sb, In/Se, Sb/Te, Ge/Te, Ge/Sb/Te, In/Sb/Te, Ga/Se/Te, Sn/Sb/Te, In/Sb/Ge, Ag/In/Sb/Te, Ge/Sn/Sb/Te, Ge/Sb/Se/Te and Te/Ge/Sb/S. In the family of Ge/Sb/Te alloys, a wide range of alloy compositions may be workable. The compositions can be characterized as $Te_aGe_bSb_{100-(a+b)}$. One researcher has described the most useful alloys as having an average concentration of Te in the deposited materials well below 70%, typically below about 60% and ranged in general from as low as about 23% up to about 58% Te and most preferably about 48% to 58% Te. Concentrations of Ge were above about 5% and ranged from a low of about 8% to about 30% average in the material, remaining generally below 50%. Most preferably, concentrations of Ge ranged from about 8% to about 40%. The remainder of the principal constituent elements in this composition was Sb. These percentages are atomic percentages that total 100% of the atoms of the constituent elements. (Ovshinsky U.S. Pat. No. 5,687,112 patent, cols. 10-11.) Particular alloys evaluated by another researcher include $Ge_2Sb_2Te_5$, $GeSb_2Te_4$ and $GeSb_4Te_7$ (Noboru Yamada, "Potential of Ge—Sb—Te Phase-Change Optical Disks for High-Data-Rate Recording", SPIE v.3109, pp. 28-37 (1997).) More generally, a transition metal such as chromium (Cr), iron (Fe), nickel (Ni), niobium (Nb), palladium (Pd), platinum (Pt) and mixtures or alloys thereof may be combined with Ge/Sb/Te to form a phase change alloy that has programmable resistive properties. Specific examples of memory materials that may be useful are given in Ovshinsky '112 at columns 11-13, which examples are hereby incorporated by reference.

Chalcogenides and other phase change materials are doped with impurities in some embodiments to modify conductivity, transition temperature, melting temperature, and other properties of data storage elements using the doped chalcogenides. Representative impurities used for doping chalcogenides include nitrogen, silicon, oxygen, silicon dioxide, silicon nitride, copper, silver, gold, aluminum, aluminum oxide, tantalum, tantalum oxide, tantalum nitride, titanium and titanium oxide. See, e.g., U.S. Pat. No. 6,800,504, and U.S. Patent Application Publication No. U.S. 2005/0029502.

Phase change alloys are capable of being switched between a first structural state in which the material is in a generally amorphous solid phase, and a second structural state in which the material is in a generally crystalline solid phase in its local order in the active channel region of the cell. These alloys are at least bistable. The term amorphous is used to refer to a relatively less ordered structure, more disordered than a single crystal, which has the detectable characteristics such as higher electrical resistivity than the crystalline phase. The term crystalline is used to refer to a relatively more ordered structure, more ordered than in an amorphous structure, which has detectable characteristics such as lower electrical resistivity than the amorphous phase. Typically, phase change materials may be electrically switched between different detectable states of local order across the spectrum between completely amorphous and completely crystalline states. Other material characteristics affected by the change between amorphous and crystalline phases include atomic order, free electron density and activation energy. The material may be switched either into different solid phases or into mixtures of two or more solid phases, providing a gray scale between completely amorphous and completely crystalline states. The electrical properties in the material may vary accordingly.

Phase change alloys can be changed from one phase state to another by application of electrical pulses. It has been observed that a shorter, higher amplitude pulse tends to change the phase change material to a generally amorphous state. A longer, lower amplitude pulse tends to change the phase change material to a generally crystalline state. The energy in a shorter, higher amplitude pulse is high enough to allow for bonds of the crystalline structure to be broken and short enough to prevent the atoms from realigning into a crystalline state. Appropriate profiles for pulses can be determined, without undue experimentation, specifically adapted to a particular phase change alloy. In following sections of the disclosure, the phase change material is referred to as GST, and it will be understood that other types of phase change materials can be used. A material useful for implementation of a PCRAM described herein is $Ge_2Sb_2Te_5$.

Other programmable resistive memory materials may be used in other embodiments of the invention, including other materials that use different crystal phase changes to determine resistance, or other memory materials that use an electrical pulse to change the resistance state. Examples include materials for use in resistance random access memory (RRAM) such as metal-oxides including tungsten-oxide ($WO_x$), NiO, $Nb_2O_5$, $CuO_2$, $Ta_2O_5$, $Al_2O_3$, CoO, $Fe_2O_3$, $HfO_2$, $TiO_2$, $SrTiO_3$, $SrZrO_3$, $(BaSr)TiO_3$. Additional examples include materials for use in magnetoresistance random access memory (MRAM) such as spin-torque-transfer (STT) MRAM, for example at least one of CoFeB, Fe, Co, Ni, Gd, Dy, CoFe, NiFe, MnAs, MnBi, MnSb, $CrO_2$, $MnOFe_2O_3$, $FeOFe_2O_5$, $NiOFe_2O_3$, $MgOFe_2$, EuO, and $Y_3Fe_5O_{12}$. See, for example, US Publication No 2007/0176251 entitled "Magnetic Memory Device and Method of Fabricating the Same", which is incorporated by reference herein. Additional examples include solid electrolyte materials used for programmable-metallization-cell (PMC) memory, or nano-ionic memory, such as silver-doped germanium sulfide electrolytes and copper-doped germanium sulfide electrolytes. See, for example, N. E. Gilbert et al., "A macro model of programmable metallization cell devices," Solid-State Electronics 49 (2005) 1813-1819, which is incorporated by reference herein.

An exemplary method for forming chalcogenide material uses PVD-sputtering or magnetron-sputtering method with source gas(es) of Ar, $N_2$, and/or He, etc. at the pressure of 1 mTorr~100 mTorr. The deposition is usually done at room temperature. A collimator with an aspect ratio of 1~5 can be used to improve the fill-in performance. To improve the fill-in performance, a DC bias of several tens of volts to several hundreds of volts is also used. On the other hand, the combination of DC bias and the collimater can be used simultaneously.

An exemplary method for forming chalcogenide material uses chemical vapor deposition CVD such as that disclosed in US Publication No 2006/0172067 entitled "Chemical Vapor Deposition of Chalcogenide Materials", which is incorporated by reference herein.

A post-deposition annealing treatment in a vacuum or in an $N_2$ ambient is optionally performed to improve the crystallize state of chalcogenide material. The annealing temperature typically ranges from 100° C. to 400° C. with an anneal time of less than 30 minutes.

Figure 12:
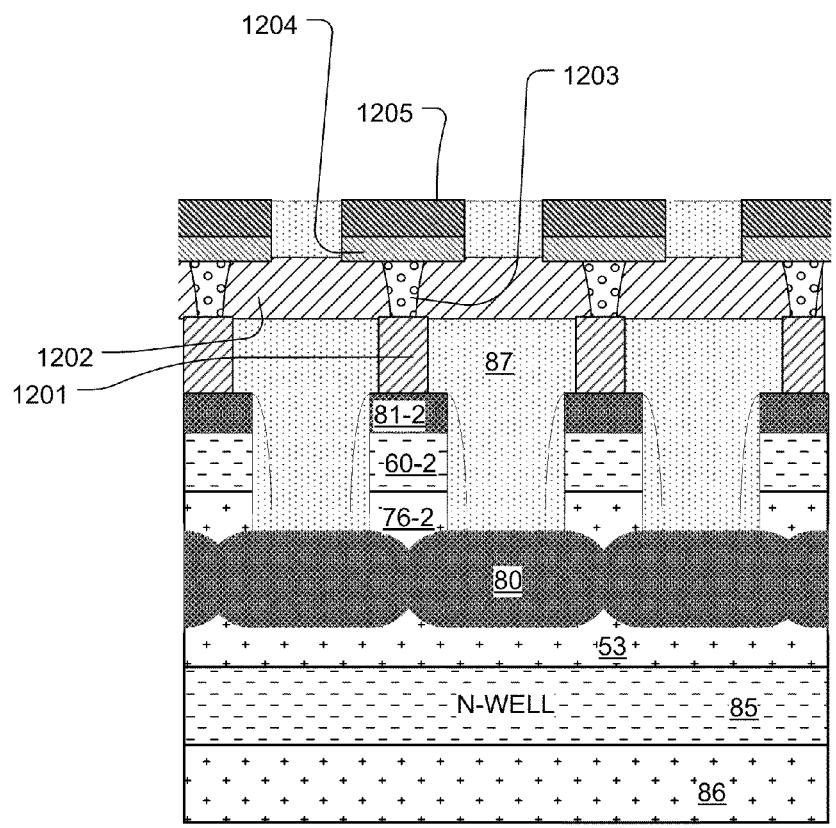
FIG. 12 illustrates a stage in manufacturing a "pore" style, phase change data storage element on the diode driver of FIG. 9.

FIG. 12 is a cross-section showing a stage in manufacturing of an integrated circuit memory where "pore" style data storage elements are coupled between the silicide word line 80, with diode drivers as shown in FIG. 9, and overlying bit lines (e.g. bit line 1107). Structures shown in FIG. 9 are given the same reference numerals in FIG. 12 and not described again. The structure shown in FIG. 12 can be made by first forming an array of conductive plugs (e.g. plug 1201) through the interlayer dielectric 87, and in contact with corresponding silicide caps (e.g. cap 81-2) in the array of diode drivers. In a representative process, a tungsten plug technology is utilized to make the plug 1201. Next, a layer 1202 of a dielectric such as silicon nitride is formed over the plugs. Openings are patterned over the plugs through the dielectric layer 1202 to define small pores in the layer 1202 which open to the underlying plug 1201. The pores are then filled with phase change material 1203 to form "pore" type phase change data storage elements. Again, a wide variety of technologies can be used to form pore type data storage elements. A top electrode material 1204 and a bit line material 1205 are then deposited and patterned over the phase change elements 1203. Thus, a data storage element 1203 is coupled between the plug 1201 and the top electrode 1204. An overlying bit line 1205 and an underlying word line 80 are used to access the device using the diode driver, which includes a single crystal silicon node 76-2 on the silicide word line 80.

The "mushroom" style and "pore" style data storage elements which have been described are representative of a number of different types of memory structures that have been developed for programmable resistance memory devices. The buried silicide word line and driver technology described herein can be applied to memory cells having any configuration with diode driver techniques.

Figure 13:
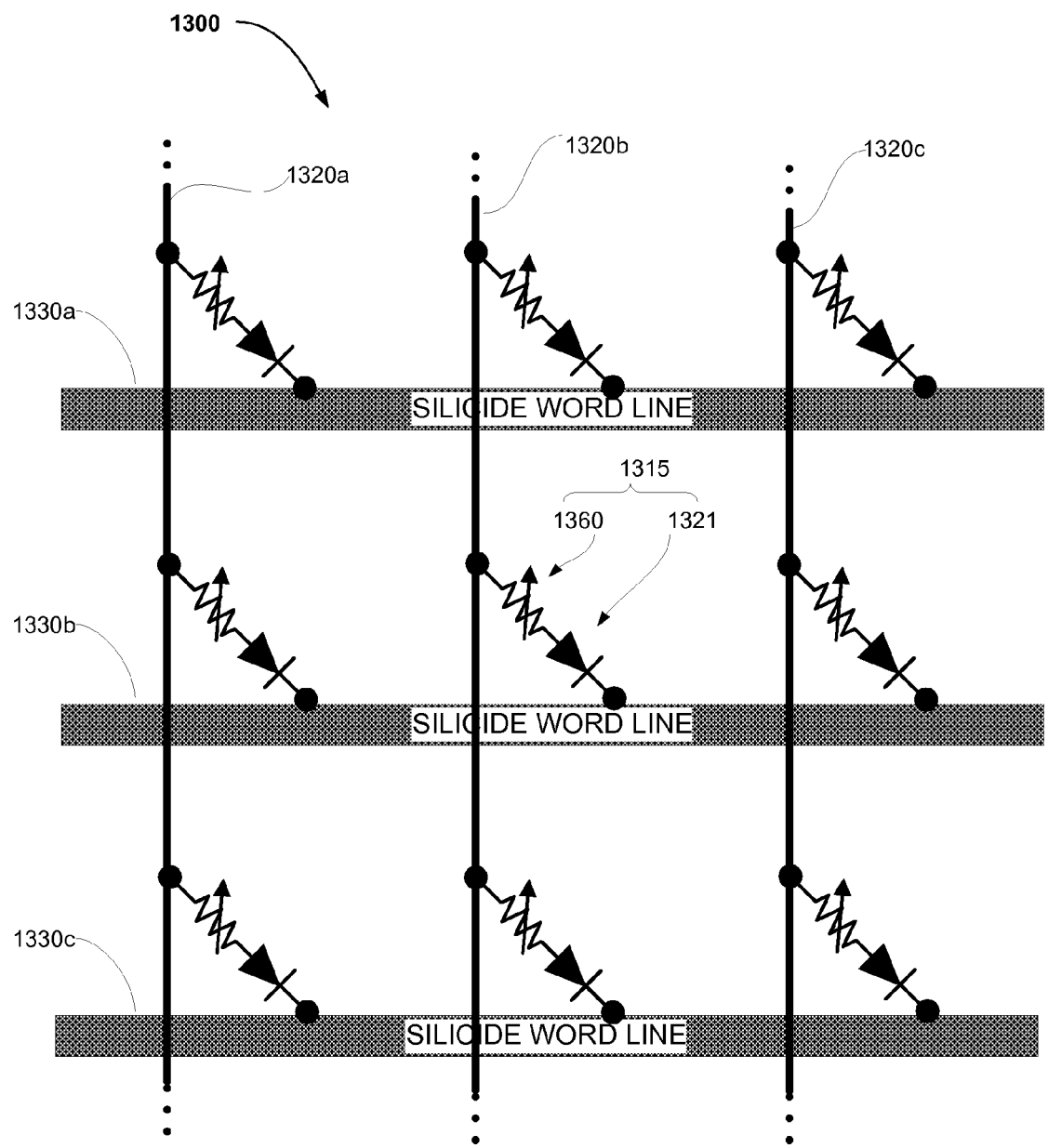
FIG. 13 is a circuit diagram of a portion of a memory array including diode drivers as described herein.

FIG. 13 is a schematic diagram of a portion of a memory array 1300 implemented using memory devices and diode access devices as described herein. In alternatives, access device other than diodes, which also include pn-junctions may be used, such as bipolar junction transistors. Each of the memory cells of array 1300 includes a diode access device and a data storage element (represented in FIG. 13 by a variable resistor) capable of being set to one of a plurality of resistive states and thus capable of storing one or more bits of data.

The array 1300 includes a plurality of buried silicide word lines 1330*a* through 1330*c*, as described above, including word lines 1330*a*, 1330*b*, and 1330*c* extending in parallel in a first direction, and a plurality of bit lines 1320 including bit lines 1320*a*, 1320*b*, and 1320*c* extending in parallel in a second direction generally perpendicular to the first direction. The word lines 1330*a* through 1330*c* and bit lines 1320 are arranged typically in such a manner that a given word line 1330*a*, 1330*b*, 1330*c* and a given bit line 1320 cross over each other but do not physically intersect.

Memory cell 1315 is representative of the memory cells of array 1300. The memory cell 1315 includes a diode access device 1321 and a data storage element 1360 arranged in series; the diode 1321 is electrically coupled to the word line 1330*b* and the data storage element 1360 is electrically coupled to the bit line 1320*b* (or vice-versa).

Reading or writing to memory cell 1315 of array 1300 can be achieved by applying appropriate voltages and/or currents to the corresponding word line 1330*b* and bit line 1320*b* to induce a current through a selected memory cell 1315. The level and duration of the voltages/currents applied is dependent upon the operation performed, e.g., a reading operation or a writing operation.

In a reset (or erase) operation of memory cell 1315 having data storage element 1360 including a phase change material, a reset pulse is applied to the corresponding word line 1330*b* and bit line 1320*b* to cause a transition of an active region of the phase change material into an amorphous phase, thereby setting the phase change material to a resistance within a resistive value range associated with the reset state. The reset pulse is a relatively high energy pulse, sufficient to raise the temperature of at least the active region of the data storage element 1360 above the melting temperature to place at least the active region in a liquid state. The reset pulse is then quickly terminated, resulting in a relatively quick quenching time as the active region quickly cools to below the transition temperature so that the active region stabilizes to an amorphous phase.

In a set (or program) operation of memory cell 1315 having data storage element 1360 including a phase change material, a program pulse is applied to the corresponding word line 1330b and bit line 1320b of suitable amplitude and duration to induce a current sufficient to raise the temperature of at least a portion of the active region above the transition temperature and cause a transition of a portion of the active region from the amorphous phase into a crystalline phase, this transition lowering the resistance of the data storage element 1360 and setting the memory cell 1315 to the desired state.

In a read (or sense) operation of the data value stored in memory cell 1315 having data storage element 1360 comprising phase change material, a read pulse is applied to the corresponding word line 1330b and bit line 1320b of suitable amplitude and duration to induce current to flow that does not result in the data storage element 1360 undergoing a change in resistive state. The current through the memory cell 1315 is dependent upon the resistance of the data storage element 1360 and thus the data value stored in the memory cell 1315.

Figure 14:
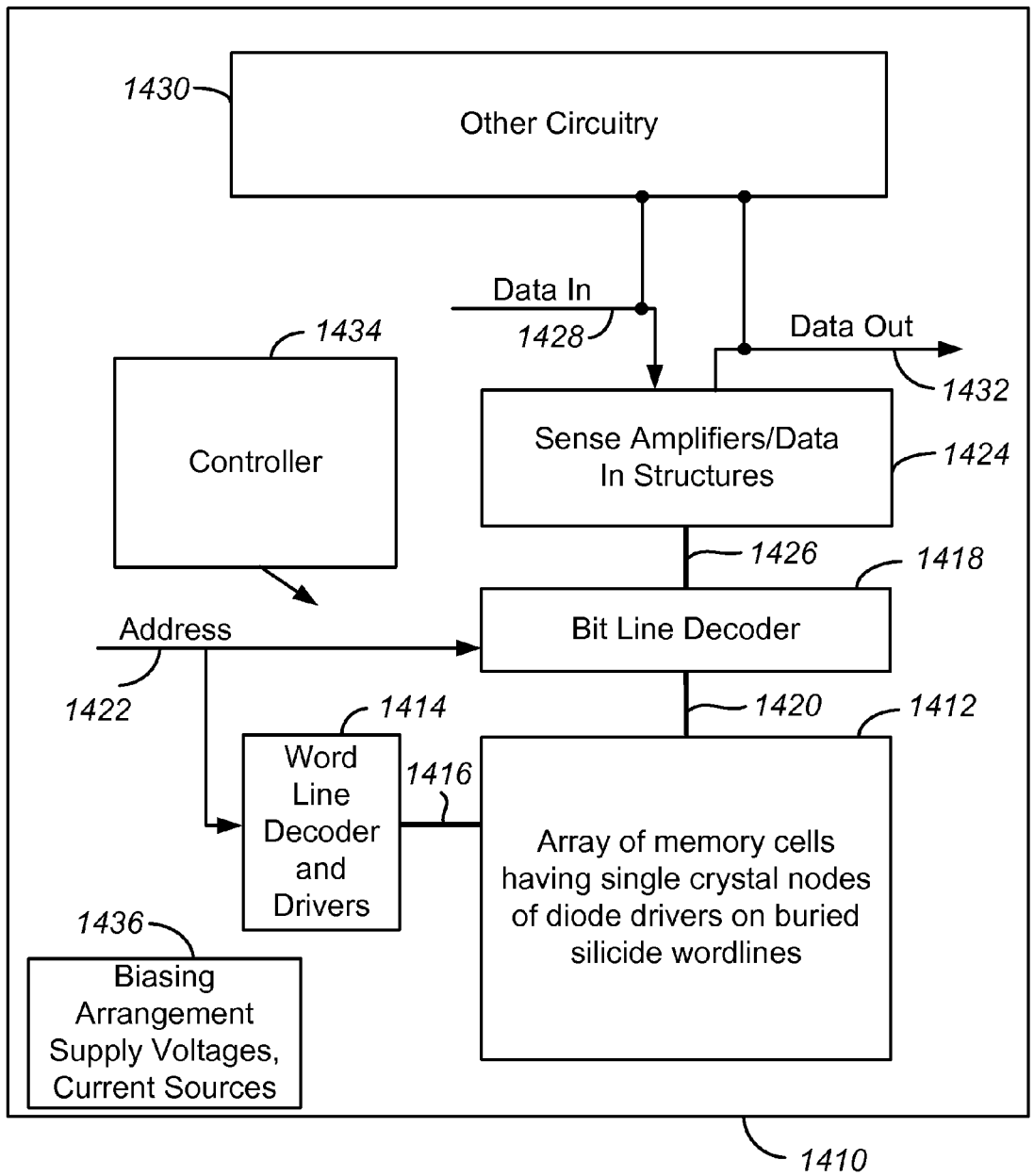
FIG. 14 is a block diagram of an integrated circuit memory device including buried silicide word lines and drivers having single crystal silicon nodes on the silicide word lines.

FIG. 14 is a simplified block diagram of an integrated circuit 1410 including a memory array 1412 implemented using memory cells having a memory plane overlying diode drivers coupled by single crystal nodes to buried silicide word lines as described herein. A word line decoder 1414 having read, set and reset modes is coupled to and in electrical communication with a plurality of word lines 1416, which are in turn coupled to buried silicide word lines as described above, arranged along rows in the memory array 1412. A bit line (column) decoder 1418 is in electrical communication with a plurality of bit lines 1420 arranged along columns in the array 1412 for reading, setting, and resetting the phase change memory cells (not shown) in array 1412. Addresses are supplied on bus 1422 to word line decoder and drivers 1414 and bit line decoder 1418. Sense amplifiers and data-in structures in block 1424, including voltage and/or current sources for the read, set, and reset modes are coupled to bit line decoder 1418 via data bus 1426. Data is supplied via a data-in line 1428 from input/output ports on integrated circuit 1410, or from other data sources internal or external to integrated circuit 1410, to data-in structures in block 1424. Other circuitry 1430 may be included on integrated circuit 1410, such as a general purpose processor or special purpose application circuitry, or a combination of modules providing system-on-a-chip functionality supported by array 1412. Data is supplied via a data-out line 1432 from the sense amplifiers in block 1424 to input/output ports on integrated circuit 1410, or to other data destinations internal or external to integrated circuit 1410.

A controller 1434 implemented in this example, using a bias arrangement state machine, controls the application of bias arrangement supply voltages and current sources 1436, such as read, program, erase, erase verify and program verify voltages and/or currents. Controller 1434 may be implemented using special-purpose logic circuitry as known in the art. In alternative embodiments, controller 1434 comprises a general-purpose processor, which may be implemented on the same integrated circuit to execute a computer program to control the operations of the device. In yet other embodiments, a combination of special-purpose logic circuitry and a general-purpose processor may be utilized for implementation of controller 1434.

An integrated circuit memory device has been described, including a buried silicide word line structure with diode drivers based on a single crystal silicon node on top of the silicide, along with processes for making the structure. The silicide word line beneath a single crystal silicon node can act to provide a conductive path on the integrated circuit among components, as an alternative to buried diffusion lines or other doped semiconductor components. Also, the silicide conductor prevents migration of carriers from the single crystal silicon node into a substrate or adjacent devices, which can activate parasitic devices in the integrated circuit. In addition, the manufacturing techniques described herein are compatible with the making of very small, dense integrated circuit components.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

We claim:

1. A memory device, comprising:
  a silicide element on a silicon substrate;
  a single crystal silicon node on the silicide element, the node being separated from the silicon substrate by the silicide element;
  a second semiconductor node, the single crystal silicon node and the second semiconductor node defining a pn-junction therebetween; and
  a data storage element coupled between the second semiconductor node and an overlying access line.

2. The device of claim 1, wherein the data storage element comprises a phase change memory material.

3. The device of claim 1, wherein the second semiconductor node comprises single crystal silicon.

4. The device of claim 1, wherein the second semiconductor node comprises polycrystalline silicon.

5. The device of claim 1, wherein the substrate comprises a single crystal silicon body.

6. The device of claim 1, wherein the silicide element comprises a metal silicide.

7. The device of claim 1, including a silicide cap on the second semiconductor node.

8. An integrated circuit memory device, comprising:
  a single crystal semiconductor body including a top surface and plurality of single crystal semiconductor features protruding from the top surface of the body;
  a silicide conductor having first portions on the top surface of the body between protruding single crystal semiconductor features in the plurality of single crystal semiconductor features, and second portions abutting adjacent first portions, and extending through the protruding single crystal semiconductor features, whereby single crystal semiconductor nodes on protruding single crystal semiconductor features are separated from the single crystal semiconductor body by the silicide conductor;
  a plurality of second semiconductor nodes on respective single crystal semiconductor nodes in the plurality of single crystal semiconductor nodes, the single crystal semiconductor nodes and the second semiconductor nodes defining pn-junctions therebetween;
  a plurality of data storage elements coupled to respective second semiconductor nodes in the plurality of second semiconductor nodes; and
  a plurality of access lines overlying and coupled to respective data storage elements in the plurality of data storage elements.

9. The device of claim 8, wherein the plurality of data storage elements comprise phase change material.

10. The device of claim 8, wherein the second semiconductor nodes in the plurality of second semiconductor nodes comprise single crystal silicon.

11. The device of claim 8, wherein the second semiconductor nodes in the plurality of second semiconductor nodes comprise polycrystalline silicon.

12. The device of claim 8, wherein the silicide conductor comprises a metal silicide.

13. The device of claim 8, including silicide caps on the plurality of second semiconductor nodes.

14. A method for making an integrated circuit device, comprising
providing a single crystal silicon body;
forming a protruding element on the single crystal silicon body;
forming a silicide conductor separating an upper portion of the protruding element from an underlying portion of the single crystal silicon body;
providing a second semiconductor node on a remaining portion of the protruding element, having a conductivity type opposite that of the single crystal silicon body to form a pn-junction on the protruding element;
forming a data storage element in electrical communication with the second semiconductor node; and
forming an access line coupled to the data storage element.

15. The method of claim 14, wherein said forming the silicide conductor comprises inducing formation of the silicide conductor comprising:
depositing a silicide precursor on the single crystal silicon body adjacent the protruding element; and
annealing the silicide precursor to induce formation of silicide by reaction of the silicide precursor with the single crystal silicon body, the silicide formation consuming silicon of the single crystal silicon body until the silicide forms said silicide conductor.

16. The method of claim 15, including before said depositing a silicide precursor,
forming a sidewall blocking layer on sides of the protruding element including the pn-junction; and
etching into the single crystal silicon body using the sidewall blocking layer as a mask to expose a portion of the single crystal silicon body beneath the sidewall blocking layer, whereby silicide formation is blocked on an upper portion of the protruding element.

17. The method of claim 15, including prior to said depositing a silicide precursor, implanting dopants into a top portion of the protruding element to form the second semiconductor node.

18. The method of claim 14, including implanting dopants into a top portion of the protruding element to form the second semiconductor node.

19. The method of claim 14, forming a patterned semiconductor element having a second conductivity type on the protruding element to form the second semiconductor node.

* * * * *